(12) United States Patent
Dauzat et al.

(10) Patent No.: US 10,973,141 B2
(45) Date of Patent: Apr. 6, 2021

(54) COOLING SYSTEM FOR ENCLOSURE FOR ELECTRICAL NETWORK PROTECTION ELEMENT

(71) Applicant: GENERAL ELECTRIC COMPANY, Schenectady, NY (US)

(72) Inventors: Thomas Ambrose Dauzat, Shreveport, LA (US); Cecilia Espinoza Diaz, Nuevo Leon (MX); Luis Sanchez Cabral, Nuevo Leon (MX)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days.

(21) Appl. No.: 16/811,510

(22) Filed: Mar. 6, 2020

(65) Prior Publication Data
US 2020/0214158 A1 Jul. 2, 2020

Related U.S. Application Data

(63) Continuation-in-part of application No. 15/845,077, filed on Dec. 18, 2017, now Pat. No. 10,587,100.

(51) Int. Cl.
| | |
|---|---|
| *H05K 7/20* | (2006.01) |
| *H05K 5/06* | (2006.01) |
| *H05K 5/02* | (2006.01) |
| *H01H 71/02* | (2006.01) |
| *H01H 9/04* | (2006.01) |

(52) U.S. Cl.
CPC ........... *H05K 5/069* (2013.01); *H05K 5/0226* (2013.01); *H05K 7/20336* (2013.01); *H01H 9/04* (2013.01); *H01H 71/025* (2013.01)

(58) Field of Classification Search
None
See application file for complete search history.

(56) References Cited

U.S. PATENT DOCUMENTS

| | | | |
|---|---|---|---|
| 5,199,369 A | 4/1993 | Meyer et al. | |
| 5,992,098 A | 11/1999 | Flider et al. | |
| 6,421,229 B1 | 7/2002 | Campbell et al. | |
| 6,640,498 B1 | 11/2003 | Groeneveld | |
| 9,379,526 B2 * | 6/2016 | Bier | H02B 1/28 |
| 10,587,100 B2 * | 3/2020 | Dauzat | H02B 1/38 |

(Continued)

*Primary Examiner* — Courtney L Smith
(74) *Attorney, Agent, or Firm* — Eversheds Sutherland (US) LLP

(57) ABSTRACT

The disclosure generally relates to an exemplary cooling system for an enclosure that can house an electrical network protection element and provide protection to the electrical network protection element against damage in various environments such as when the enclosure is placed in an underground vault that may be flooded during rain, or when a liquid (oil, for example) comes in contact with the enclosure. The exemplary cooling system may include a coolant reservoir, one or more false walls coupled to the exterior of the enclosure, one or more pancake panels coupled to the false walls through one or more header pipes, and one or more coolant pipes for circulating coolant from the coolant reservoir, through the one or more pancake panels, false walls, and header pipes, and back to the coolant reservoir. The cooling system may only be in contact with the exterior portion of the enclosure. That is, the cooling system may not directly contact the electronics within the enclosure.

18 Claims, 18 Drawing Sheets

(56) References Cited

U.S. PATENT DOCUMENTS

| | | | |
|---|---|---|---|
| 2003/0001465 A1 | 1/2003 | Carter et al. | |
| 2004/0100770 A1* | 5/2004 | Chu | H05K 7/20754 |
| | | | 361/698 |
| 2006/0180301 A1* | 8/2006 | Baer | H05K 7/20609 |
| | | | 165/299 |
| 2009/0045203 A1* | 2/2009 | Ehrlich | E05G 1/02 |
| | | | 220/592.01 |
| 2013/0293076 A1* | 11/2013 | Karandikar | H02B 1/46 |
| | | | 312/296 |
| 2015/0075080 A1* | 3/2015 | Ellingson | H05K 5/061 |
| | | | 49/483.1 |
| 2015/0282363 A1 | 10/2015 | Bier et al. | |
| 2016/0337037 A1* | 11/2016 | Fevrier | H04B 10/40 |
| 2018/0139859 A1 | 5/2018 | Reese et al. | |
| 2019/0190241 A1 | 6/2019 | Dauzat et al. | |
| 2020/0106247 A1 | 4/2020 | Dauzat et al. | |
| 2020/0214152 A1 | 7/2020 | Dauzat et al. | |

* cited by examiner

COOLING SYSTEM FOR ENCLOSURE FOR ELECTRICAL NETWORK PROTECTION ELEMENT

FIELD OF THE DISCLOSURE

This disclosure relates to enclosures, and more particularly, to an enclosure for housing an electrical network protection element, and more particularly to a cooling system found on the enclosure.

BACKGROUND OF THE DISCLOSURE

An electrical protection element such as a circuit breaker or a fuse is typically used to protect a circuit, a device, or a system from being damaged due to an abnormal condition such as an over-voltage condition or an over-current condition. The characteristics of the electrical protection element are defined in large part by the nature of the application where the electrical protection element is used. Thus, a small fuse may be adequate to protect an electronic circuit board while a heavy-duty circuit breaker may be required to protect a transformer in an electric utility facility. Furthermore, the fuse used in the electronic circuit board may be selected without any undue attention being paid to a waterproofing aspect of the fuse. On the other hand, the heavy-duty circuit breaker may require specific attention to be paid to environmental factors such as temperature, humidity, and moisture, because the transformer may be exposed to natural elements such as the sun, rain, and snow. Consequently, in such applications, the electrical protection element may be placed inside a protective housing such as a utility hut or a water-proof enclosure.

In some cases, an electrical protection element may be housed inside a water-proof enclosure that is installed inside an underground structure. While it is expected that water would not normally flow into the underground structure, in some situations such as during heavy rainfall, water may enter the underground structure. The water-proof enclosure must therefore be constructed to prevent this water from coming in contact with the electrical protection element.

In some other cases, an electrical protection element may be housed inside a water-proof enclosure that is submerged under water, such as a body of water. Here again, the water-proof enclosure must be constructed to prevent water from coming in contact with the electrical protection element.

The water-proof enclosure must however, allow a person such as a technician, to open the water-proof enclosure in order to gain access to the electrical protection element for various reasons, such as to replace parts or to make a visual inspection of the electrical protection element. Consequently, such conflicting requirements should be taken into consideration when designing a water-proof enclosure. Some conventional solutions fail to satisfy at least some of these conflicting requirements, thereby exposing the electrical protection element to potential damage and/or making it difficult for a technician to access the electrical protection element.

Additionally, temperatures inside the housing may be maintained to prevent overheating of the breaker's relays, circuit boards, and wiring insulation to prevent dielectric insulation failure on those components controlling the disconnecting contacts protecting the transformer. A breaker electrical component dielectric insulation failure may cause the network protector to not properly work, for example, either through short circuit or melting resulting in transformer failure. Conventional protector temperatures may be maintained by tank housing material and fin applications due to its passive heat transfer nature. Pumps and fans may not be allowed in the utility industry due to housing being submerged, the environment having high levels of corrosion water, and the housing having to be maintenance free.

BRIEF SUMMARY OF THE DISCLOSURE

Embodiments of the disclosure can provide an enclosure for protecting electrical components from external environmental conditions, for example if the enclosure is placed underwater. More particularly, embodiments of the disclosure can provide a cooling system on the enclosure that is configured to cool the electrical components housed in the enclosure.

In at least one embodiment, an enclosure for an electrical network protection element can be provided. The enclosure may include a housing having an interior portion configured to accommodate the electrical network protection element. The enclosure may also include a flange attached to the housing. The enclosure may also include a first door hingeably attached to a first vertical side of the flange, the first door including a first wedge projection along a beveled inner edge of the first door. The enclosure may also include a second door hingeably attached to a second vertical side of the flange, the second door including a first channel gasket along a beveled inner edge of the second door, the first channel gasket of the second door arranged to provide a compression sealing in cooperation with the first wedge projection in the beveled inner edge of the first door. The enclosure may include a cooling system connected to the housing. The cooling system may include one or more false walls connected to an external surface of the housing. The cooling system may include one or more panels connected to at least one of the one or more false walls. The cooling system may include one or more coolant transfer pipes connected to the one or more panels and further connected to a coolant reservoir, wherein the one or more coolant transfer pipes circulate coolant through at least one of: the coolant reservoir, the one or more panels, and the one or more false walls.

In at least one aspect of some embodiments, the one or more false walls, one or more panels, and one or more coolant transfer pipes are not in contact with the electrical network protection element located within the housing.

In at least one aspect of some embodiments, no coolant is introduced to the interior portion of the housing in which the electrical network protection element is located.

In at least one aspect of some embodiments, wherein the one or more panels are connected to at least one of the one or more false walls through one or more header pipes, wherein coolant circulates between the one or more panels and the one or more false walls through the one or more header pipes.

In at least one aspect of some embodiments, the coolant reservoir is located on an upper surface of the enclosure.

In at least one aspect of some embodiments, the one or more false walls comprise: a first false wall located between the coolant reservoir and the housing, a second false wall located on a first side of the housing, a third false wall located on a second side of the housing, and a fourth false wall located on a third side of the housing, wherein the second false wall is connected to a first panel and the third false wall is connected to a second panel.

In at least one aspect of some embodiments, a temperature gradient caused by a difference between a first temperature associated with an upper surface of the enclosure and a second temperature associated with a lower surface of the enclosure, causes coolant circulation through the cooling system.

In at least one embodiment, an enclosure for an electrical network protection element can be provided. The enclosure may include a housing having an interior portion configured to accommodate the electrical network protection element. The enclosure may include one or more doors hingeably attached to the housing. The enclosure may include a cooling system connected to the housing. The cooling system may include one or more false walls connected to an external surface of the housing. The cooling system may include one or more panels connected to at least one of the one or more false walls. The cooling system may include one or more coolant transfer pipes connected to the one or more panels and further connected to a coolant reservoir, wherein the one or more coolant transfer pipes circulate coolant through at least one of: the coolant reservoir, the one or more panels, and the one or more false walls.

In at least one aspect of some embodiments, the one or more false walls, one or more panels, and one or more coolant transfer pipes are not in contact with the electrical network protection element located within the housing.

In at least one aspect of some embodiments, no coolant is introduced to the interior portion of the housing in which the electrical network protection element is located.

In at least one aspect of some embodiments, the one or more panels are connected to at least one of the one or more false walls through one or more header pipes, wherein coolant circulates between the one or more panels and the one or more false walls through the one or more header pipes.

In at least one aspect of some embodiments, the coolant reservoir is located on an upper surface of the enclosure.

In at least one aspect of some embodiments, the one or more false walls comprise: a first false wall located between the coolant reservoir and the housing, a second false wall located on a first side of the housing, a third false wall located on a second side of the housing, and a fourth false wall located on a third side of the housing, wherein the second false wall is connected to a first panel and the third false wall is connected to a second panel.

In at least one aspect of some embodiments, a temperature gradient caused by a difference between a first temperature associated with an upper surface of the enclosure and a second temperature associated with a lower surface of the enclosure, causes coolant circulation through the cooling system.

A cooling system for an enclosure for an electrical network protection element can be provided. The cooling system may include one or more false walls connected to an external surface of a housing of the enclosure, wherein the housing of the enclosure includes an interior portion configured to accommodate the electrical network protection element. The cooling system may include one or more panels connected to at least one of the one or more false walls. The cooling system may include one or more coolant transfer pipes connected to the one or more panels and further connected to a coolant reservoir, wherein the one or more coolant transfer pipes circulate coolant through at least one of: the coolant reservoir, the one or more panels, and the one or more false walls.

In at least one aspect of some embodiments, the one or more false walls, one or more panels, and one or more coolant transfer pipes are not in contact with the electrical network protection element located within the housing.

In at least one aspect of some embodiments, no coolant is introduced to the interior portion of the housing in which the electrical network protection element is located.

In at least one aspect of some embodiments, wherein the one or more panels are connected to at least one of the one or more false walls through one or more header pipes, wherein coolant circulates between the one or more panels and the one or more false walls through the one or more header pipes.

In at least one aspect of some embodiments, the coolant reservoir is located on an upper surface of the enclosure.

In at least one aspect of some embodiments, the one or more false walls comprise: a first false wall located between the coolant reservoir and the housing, a second false wall located on a first side of the housing, a third false wall located on a second side of the housing, and a fourth false wall located on a third side of the housing, wherein the second false wall is connected to a first panel and the third false wall is connected to a second panel.

Additional systems, methods, apparatus, features, and aspects can be realized through the techniques of various embodiments of the disclosure. Other embodiments and aspects of the disclosure are described in detail herein and are considered a part of the claimed subject matter. Other features can be understood and will become apparent with reference to the description and to the drawings.

BRIEF DESCRIPTION OF THE DRAWINGS

Figure 1:
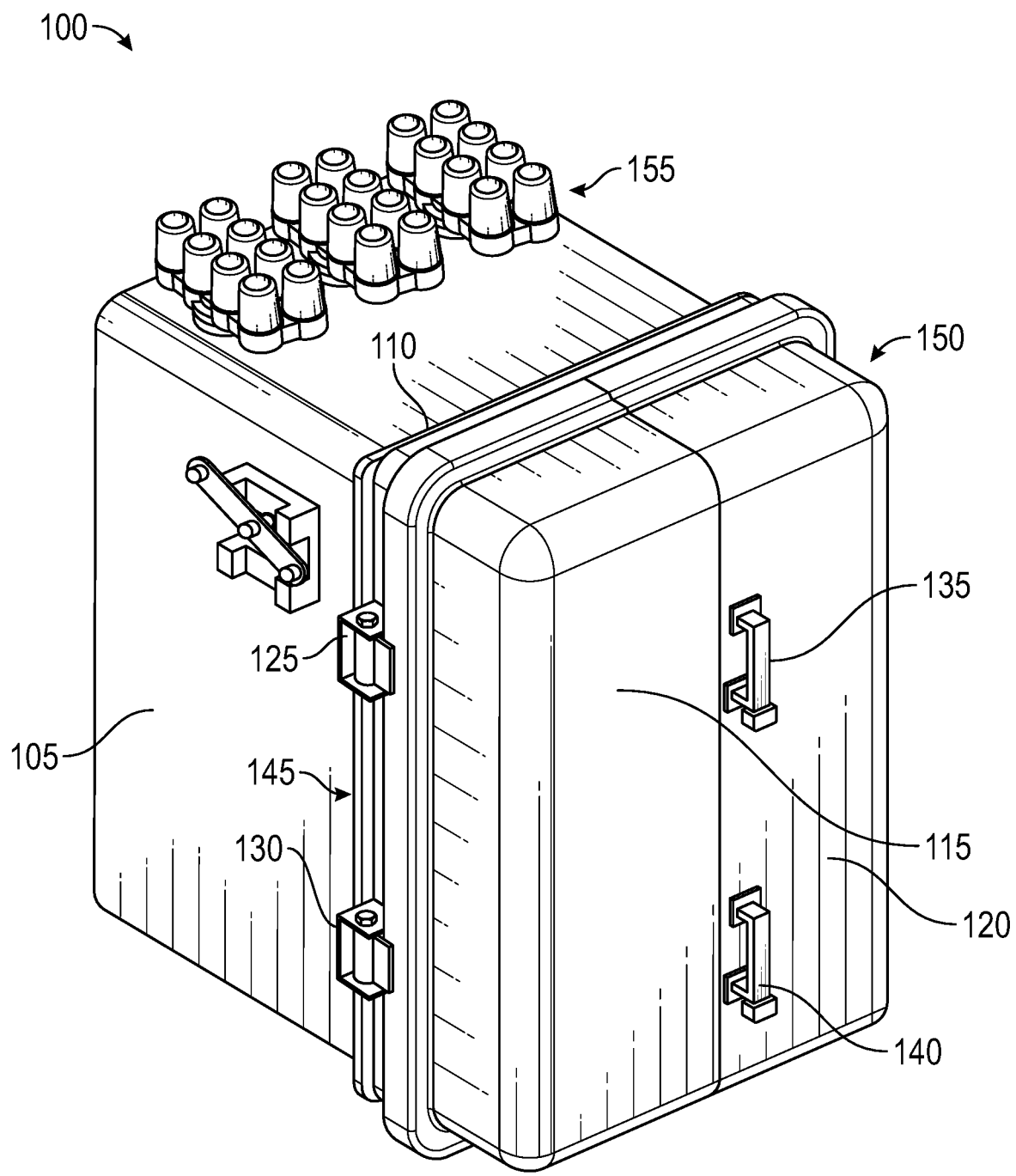

Having thus described the disclosure in general terms, reference will now be made to the accompanying drawings, which are not necessarily drawn to scale, and wherein:

FIG. 1 shows a perspective view of an exemplary enclosure that can house an electrical network protection element in accordance with an exemplary embodiment of the disclosure.

Figure 2:
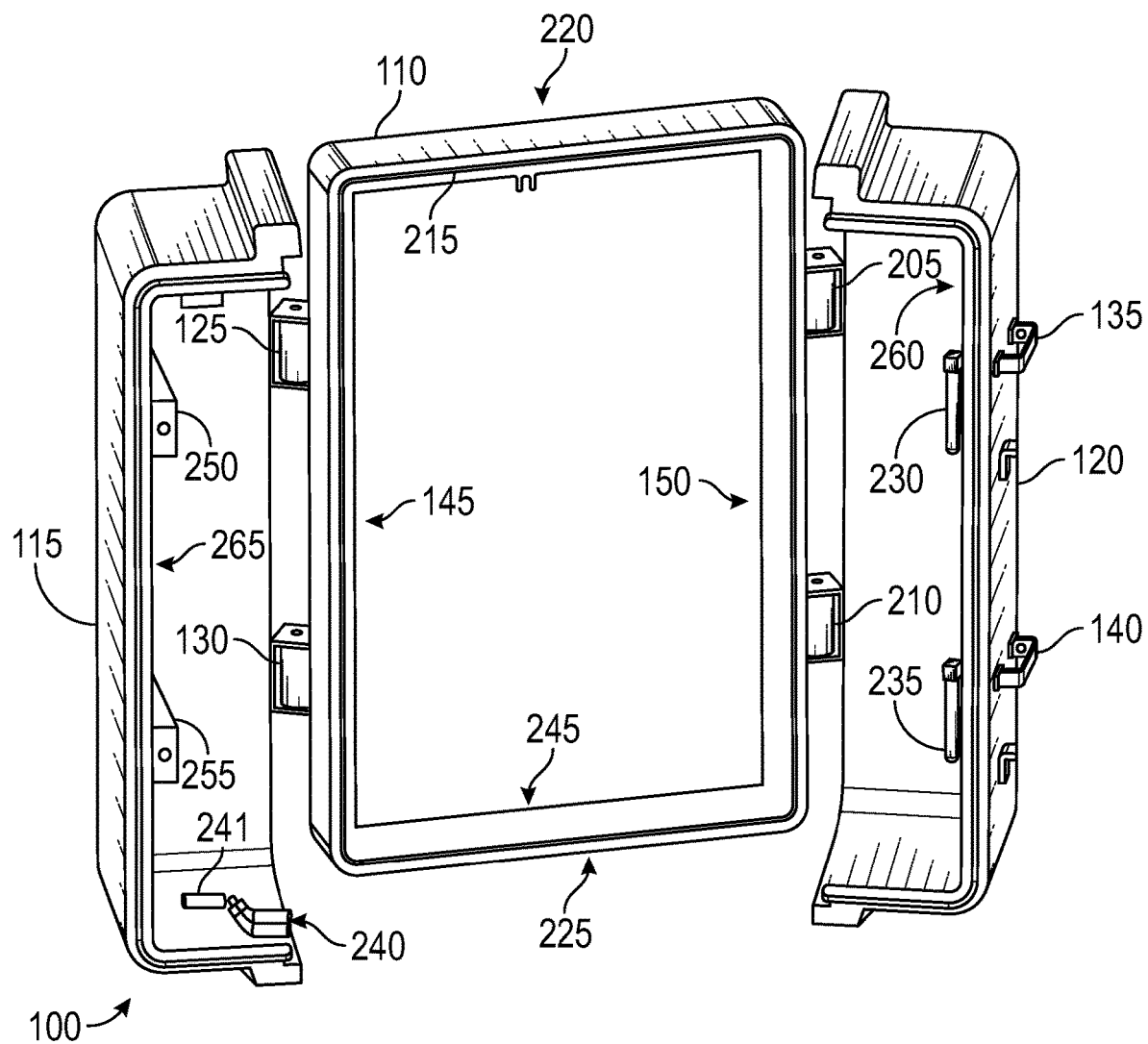

FIG. 2 shows a view of a flange when two doors of the exemplary enclosure shown in FIG. 1 are in an open position.

Figure 3:
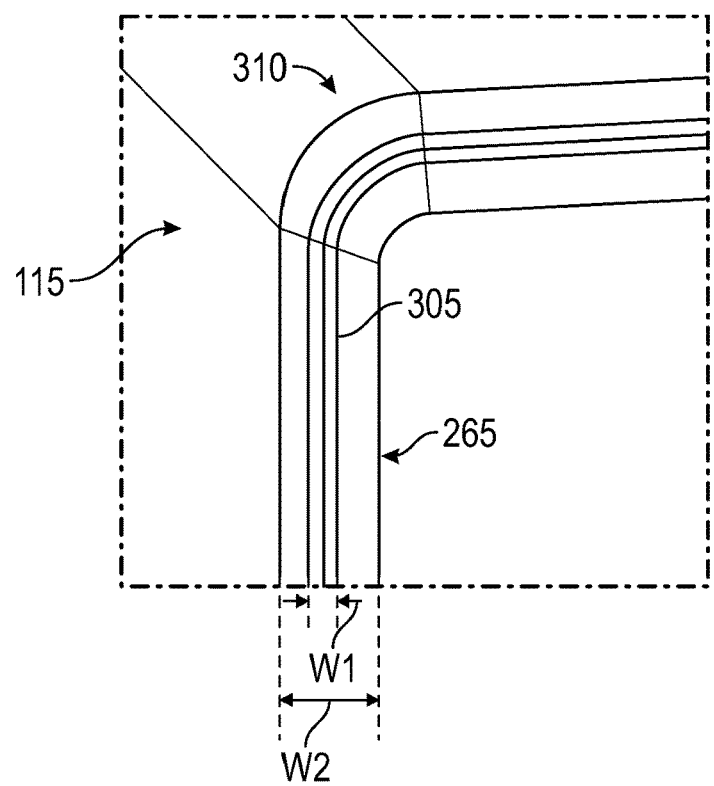

FIG. 3 shows a wedge projection in a beveled inner edge of a first door of the exemplary enclosure shown in FIG. 1.

Figure 4:
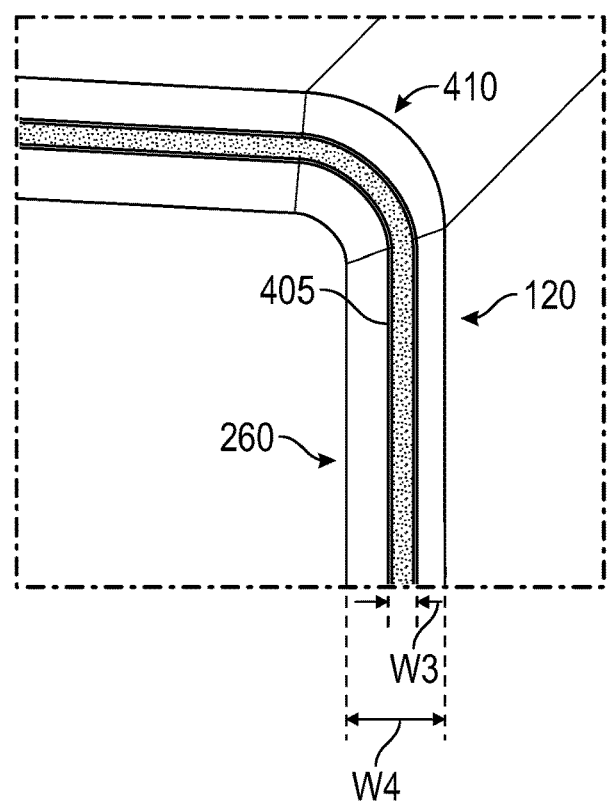

FIG. 4 shows a gasket disposed along a complementary beveled inner edge of a second door of the exemplary enclosure shown in FIG. 1.

Figure 5:
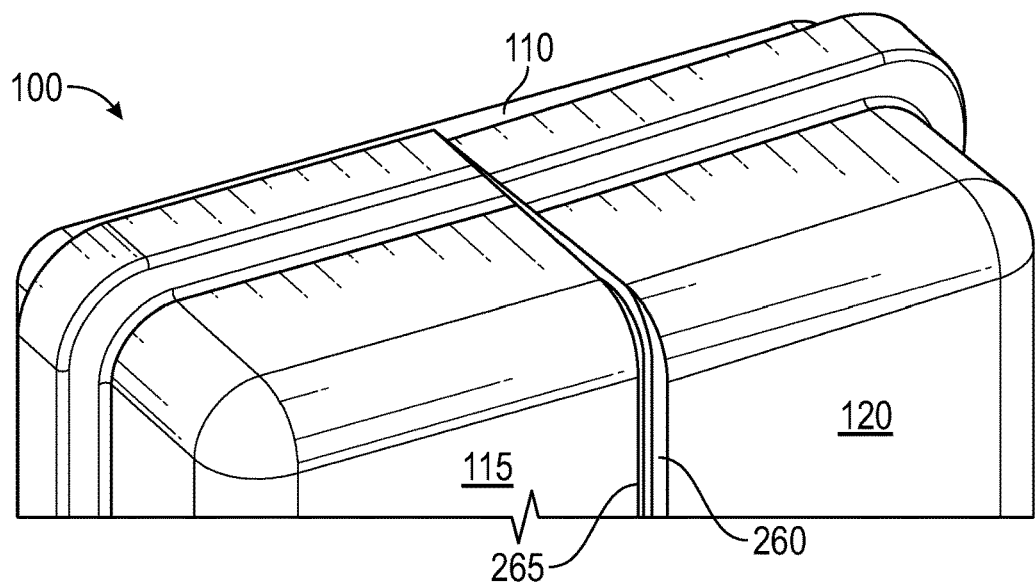

FIG. 5 shows the beveled inner edges of the two doors of the exemplary enclosure shown in FIG. 1 when in a partially closed position.

Figure 6:
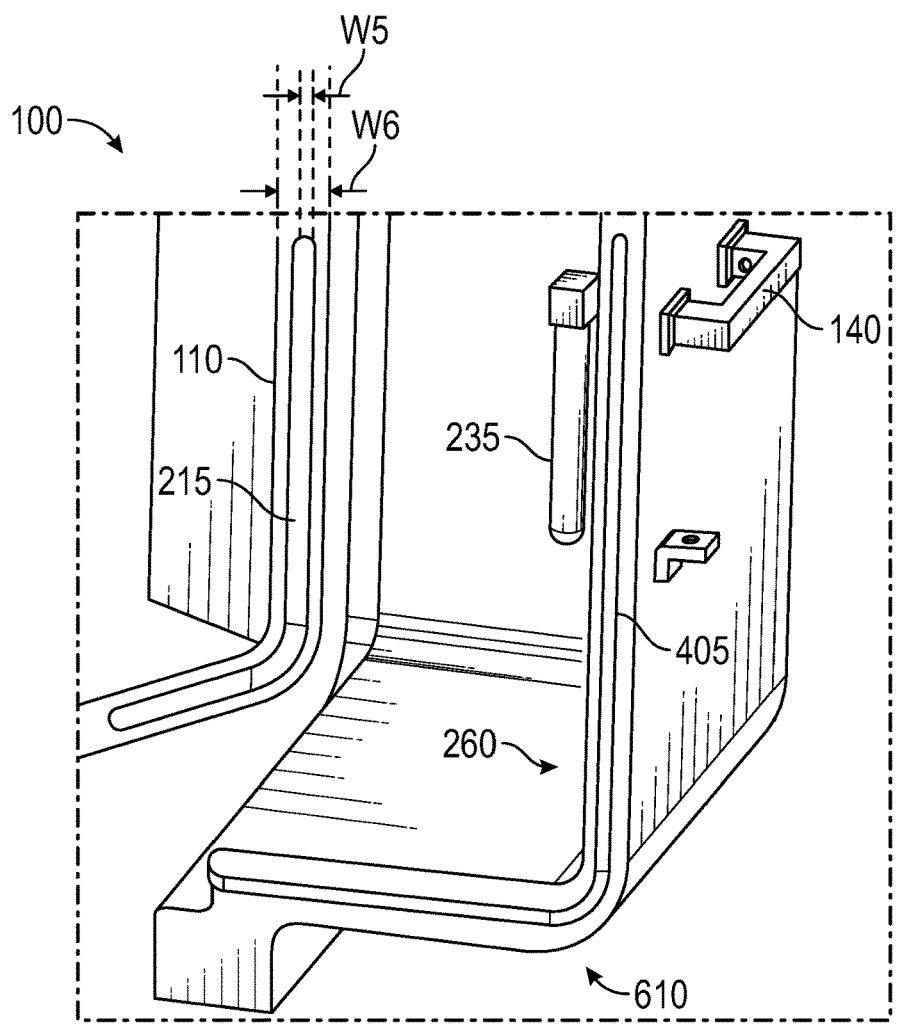

FIG. 6 shows an exemplary handle attached to the second door of the exemplary enclosure shown in FIG. 1.

Figure 7:
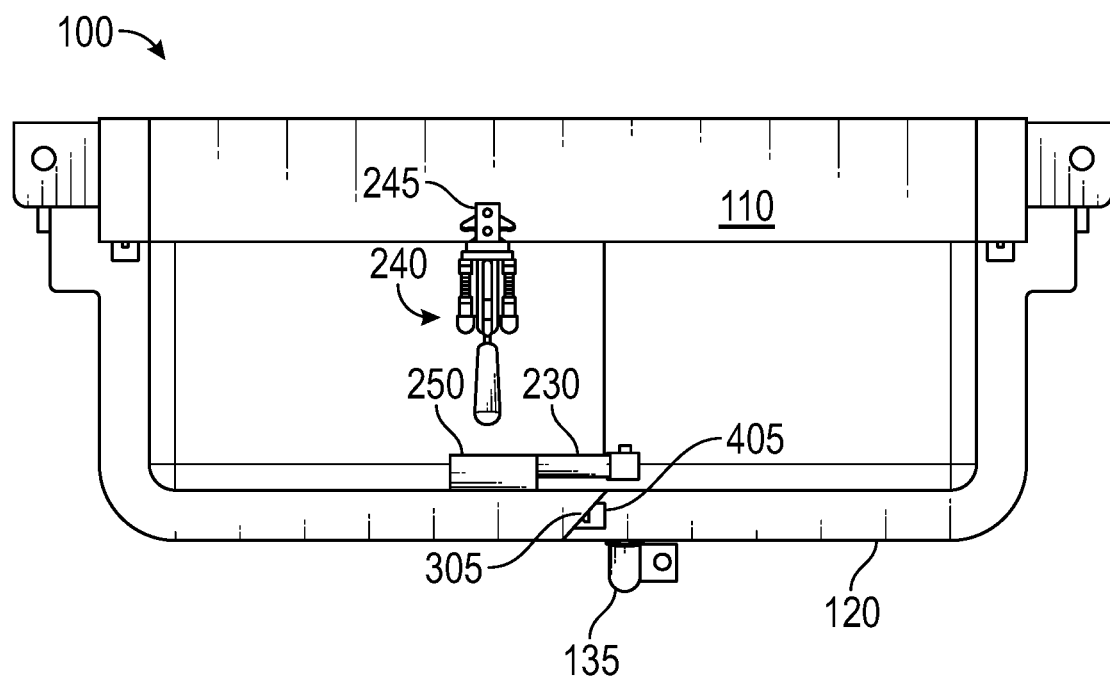

FIG. 7 shows an upper section view of an exemplary toggle clamp attached to an internal surface of the first door of the exemplary enclosure shown in FIG. 1.

Figure 8:
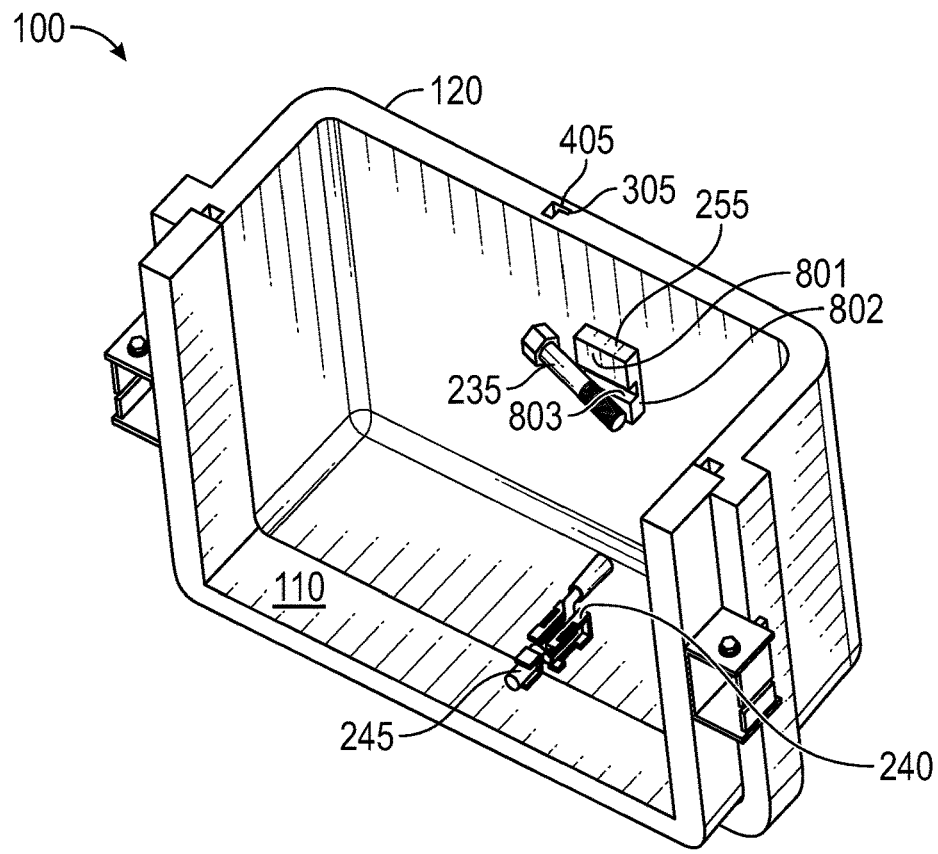

FIG. 8 illustrates a perspective view of a locking bar of the exemplary handle prior to being seated in a groove in a wedge block on an internal major surface of a door of the exemplary enclosure shown in FIG. 1.

Figure 9:
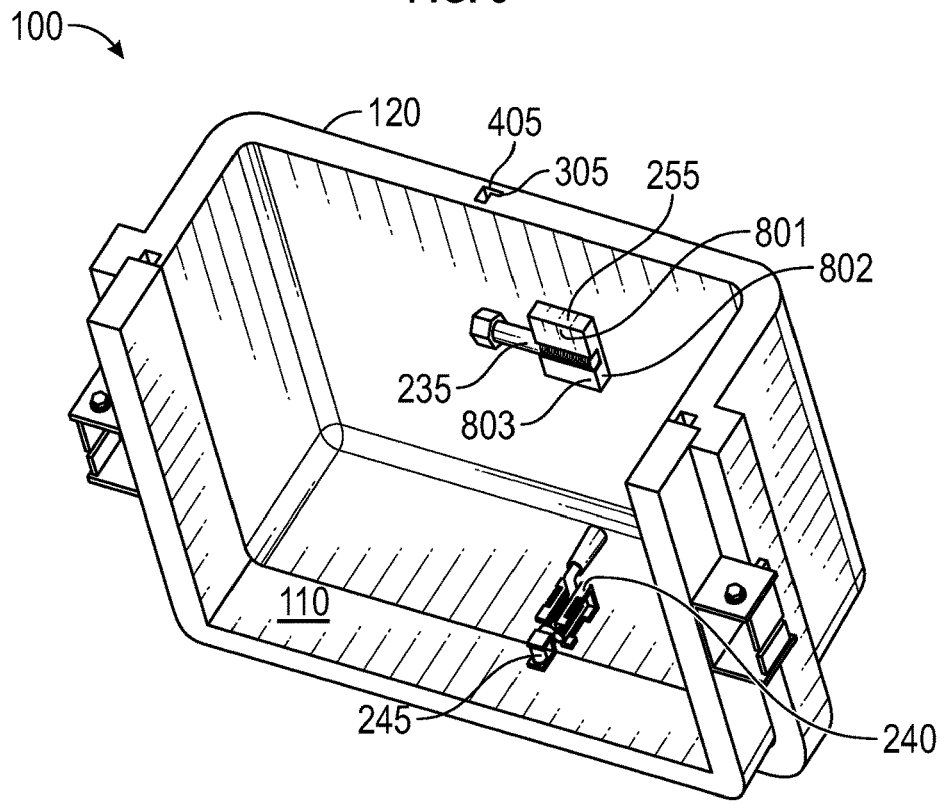

FIG. 9 illustrates the locking bar of the exemplary handle prior after being seated in the groove in the wedge block shown in FIG. 8.

FIGS. 10A-10E illustrate several exemplary perspectives of a cooling system of an enclosure depicting only the false walls of the cooling system.

FIGS. 11A-11E illustrate several exemplary perspectives of a cooling system of an enclosure depicting both the false walls and the pancake panels of the cooling system.

Figure 12A:
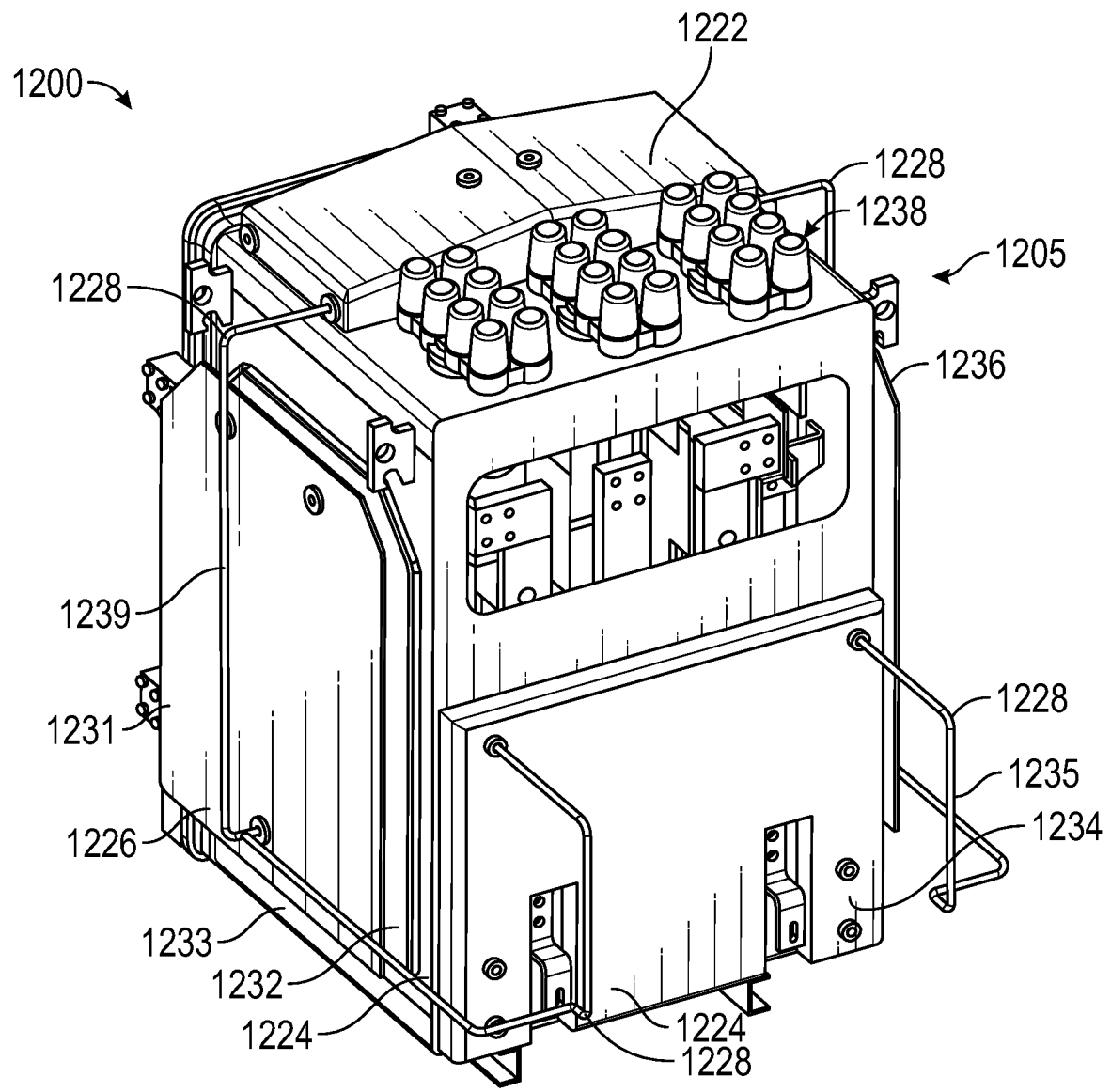
Figure 12B:
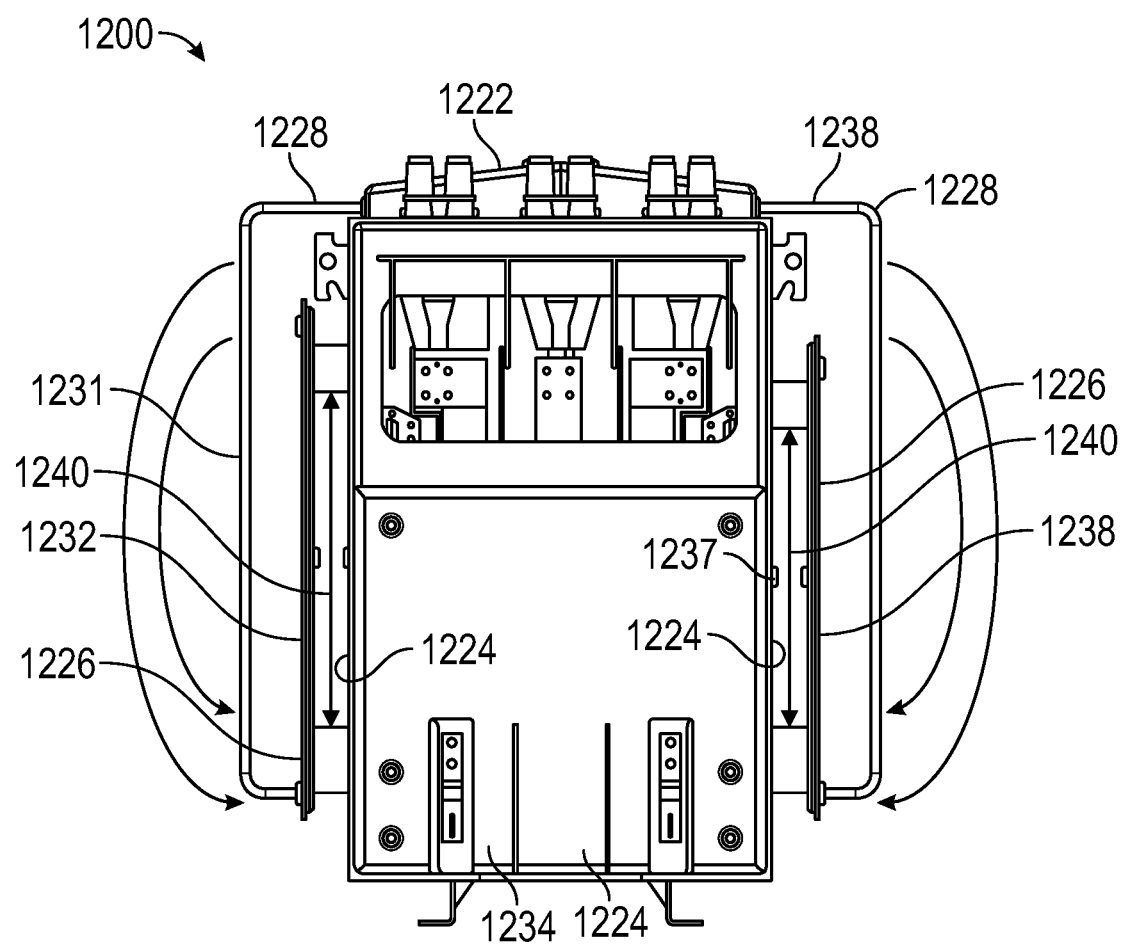

FIGS. 12A and 12B illustrate several exemplary perspectives of a cooling system of an enclosure depicting both the false walls, pancake panels, and coolant piping of the cooling system.

DETAILED DESCRIPTION OF THE DISCLOSURE

The disclosure will be described more fully hereinafter with reference to the accompanying drawings, in which exemplary embodiments of the disclosure are shown. This disclosure may, however, be embodied in many different forms and should not be construed as limited to the exemplary embodiments set forth herein; rather, these embodiments are provided so that this disclosure will satisfy applicable legal requirements. Like numbers refer to like elements throughout. It should be understood that certain words and terms are used herein solely for convenience and such words and terms should be interpreted as referring to various objects and actions that are generally understood in various forms and equivalencies by persons of ordinary skill in the art. For example, the word "gasket" as used herein refers to any of various types of gaskets such as a sealing gasket, a compression gasket, a race gasket, or a perimeter gasket. The phrase "wedge projection" as used herein may be alternatively understood as a "knife edge projection" or an "angular projection." It should also be understood that various words that pertain to an orientation, a mounting location, or a shape of an object (words such as "horizontal," "vertical," "upper," "lower," "right," and "left," for example) are used herein for describing one or more exemplary embodiments and should be interpreted as being equally applicable to other exemplary embodiments in terms of other orientations, locations, and shapes.

Furthermore, the description below may refer to a left-side door as a "first door" and a right-side door as a "second door." This is done solely for purposes of convenience and it should be understood that the various elements and operations described with respect to the first door and the second door in one example implementation are interchangeable in various other implementations. For example, a door handle that is described herein as being mounted on the second door in one example implementation can instead be mounted on the first door in an alternative implementation. A toggle clamp that is described as being attached to an internal surface of the first door in one example implementation can be attached to an internal surface of the second door in an alternative implementation. The dimensions of the two doors, and certain symmetrical features of the two doors, as shown in the figures is merely for illustrating some exemplary implementations. In other exemplary implementations, the two doors may have different shapes and dimensions (different widths, for example). The word "example" as used herein is intended to be non-exclusionary and non-limiting in nature. More particularly, the word "exemplary" as used herein indicates one among several examples, and it should be understood that no undue emphasis or preference is being directed to the particular example being described.

In terms of a general overview, described herein is an exemplary embodiment of a cooling system found on an exemplary enclosure as described herein (descriptions specific to the cooling system may be found below with respect to FIGS. 10A-12B). The exemplary enclosure, includes a housing that can house an electrical network protection element and provides protection to the electrical network protection element against damage in various environments such as when the enclosure is placed in an underground vault that may be flooded during rain, or when a liquid (oil, for example) comes in contact with the enclosure. The enclosure includes a flange attached to the housing and two doors that are hingeably attached to the flange. A wedge projection is provided all along the perimeter of the flange and facing away from the housing. A gasket is provided on the outer three edges of each door, the gasket arranged to sealingly receive the wedge projection of the flange when the doors are closed against the flange. The first door also includes a beveled inner edge having a wedge projection that projects away from the housing. The second door includes a complementary beveled inner edge having a gasket that sealingly receives the wedge projection located in the beveled inner edge of the first door when the doors are closed against the flange. The exemplary enclosure may include additional elements such as a toggle clamp that is attached to an internal surface of the first door. When the toggle clamp is engaged with a catch located in the flange, the first door is automatically pulled towards the flange and sealingly compresses the gasket provided on the outer three edges of the door against the wedge projection provided along the perimeter of the flange.

FIG. 1 shows a perspective view of an exemplary enclosure 100 for an electrical network protection element (not shown), in accordance with an exemplary embodiment of the disclosure. The enclosure 100 is configured to provide waterproofing when completely submerged in water or when in contact with various types of liquids. The electrical network protection element is accommodated inside an interior portion of a housing 105 of the enclosure 100. In some implementations, air is evacuated from the interior portion of the housing 105 and replaced with an inert gas that helps prevent or minimize oxidation of various components of the electrical network protection element while also preventing or minimizing entry of water into the interior portion.

A flange 110 is attached to the housing 105 (by welding, for example) or can be manufactured as an integral part of the housing 105. The flange 110 can include a first knuckle 125 and a second knuckle 130, each of which is a part of a hinge. A first attachment element such as a bolt, a screw, or a pin, is inserted into the first knuckle 125 and a second attachment element is similarly inserted into the second knuckle 130 for hingeably attaching a first door 115 to a first vertical side 145 of the flange 110. Two other similar knuckles (205 and 210 shown in FIG. 2) may be used to hingeably attach a second door 120 to a second vertical side 150 of the flange 110. In other implementations, a single knuckle or more than two knuckles may be provided as parts of one or more hinges for hingeably attaching each of the first door 115 and the second door 120 to respective vertical sides of the flange 110.

The flange 110, which may be a square flange or a rectangular flange for example, has a wedge-shaped projection (shown in FIG. 2) located all along a perimeter of the flange 110 and projecting away from the housing 105. The wedge-shaped projection will be described below in more detail. The first door 115 includes a gasket (not shown) that sealingly receives the wedge projection of the flange 110 when the first door 115 is closed. The gasket, which is made of a compressible material, such as rubber, is operative as a watertight seal that prevents or minimizes water from entering the housing 105 via the upper edge, the lower edge, and the outer vertical edge of the first door 115. The gasket may include several sections that may be independent of each other or may be constituent parts of a unitary gasket.

Thus, in one exemplary implementation, the gasket can be a unitary gasket that extends along the three outer edges of the first door 115 (the upper edge, the lower edge, and the outer vertical edge). In another exemplary implementation, the gasket can include multiple sections. A first section of the gasket is disposed along an upper edge of the first door 115, a second section of the gasket is disposed along a lower edge of the first door 115, and a third section of the gasket is disposed along an outer vertical edge of the first door 115. The first door 115 further includes a beveled inner edge having a wedge-shaped projection that projects away from the housing and extends all along the beveled inner edge of the first door 115. The beveled inner edge of the first door 115 includes a vertical portion extending along the front vertical surface of the first door 115 and horizontal portions extending along the upper and lower horizontal surfaces of the first door 115.

The second door 120 includes a gasket (not shown) that sealingly receives the wedge-shaped projection of the flange 110 when the second door 120 is closed. The gasket, which is made of a compressible material, such as rubber, is operative as a watertight seal that prevents or minimizes water from entering the housing 105 via the upper edge, the lower edge, and the outer vertical edge of the second door 120. The gasket may include several sections that may be independent of each other or may be constituent parts of a unitary gasket.

Thus, in one exemplary implementation, the gasket can be a unitary gasket that extends along the three outer edges of the second door 120 (the upper edge, the lower edge, and the outer vertical edge). In another exemplary implementation, the gasket can include multiple sections. A first section of the gasket is disposed along an upper edge of the second door 120, a second section of the gasket is disposed along a lower edge of the second door 120, and a third section of the gasket is disposed along an outer vertical edge of the second door 120. The second door 120 further includes a beveled inner edge having a gasket (not shown) that sealingly mates with the wedge-shaped projection provided in the beveled inner of the first door 115 when the second door 120 is closed. The beveled inner edge of the second door 120 includes a vertical portion extending along the front vertical surface of the second door 120 and horizontal portions extending along the upper and lower horizontal surfaces of the second door 120.

One or more handles, such as a first handle 135 and a second handle 140 are mounted on a front external surface of the second door 120. Further details pertaining to these two handles are provided below.

A set of terminals 155 may be provided on an upper surface of the housing 105. One or more of the set of terminals 155, which can be connected via cable, bars, or wires to the network protection element inside the housing 105, may be used for connecting the network protection element to equipment (not shown) located outside the housing 105.

FIG. 2 shows a view of the flange 110 when both the first door 115 and the second door 120 are placed in an open position. The flange 110 includes the first vertical side 145, the second vertical side 150, an upper horizontal side 220, and a lower horizontal side 225. A wedge-shaped projection 215 is provided all along the perimeter of the flange 110 and facing away from the housing. A gasket that is provided on the outer three edges of the first door 115 sealingly receives the wedge-shaped projection 215 when the first door 115 is closed against the flange 110. The outer three edges of the first door 115 correspond to the first vertical side 145, a left-half portion of the upper horizontal side 220, and a left-half portion of the lower horizontal side 225 of the flange 110. Another gasket that is provided on the outer three edges of the second door 120 sealingly receives the wedge-shaped projection 215 when the second door 120 is closed against the flange 110. The outer three edges of the second door 120 correspond to the second vertical side 150, a right-half portion of the upper horizontal side 220, and a right-half portion of the lower horizontal side 225 of the flange 110.

The wedge-shaped projection 215 sealingly engages with the gasket in each of the first door 115 and the second door 120 to provide a waterproof seal along all four sides of the flange 110 for preventing or at least minimizing entry of water or other liquids into the interior portion of the housing 105.

As indicated above, the first door 115 is hingeably attached to the first vertical side 145 by using a first hinge that includes the first knuckle 125 and a second hinge that includes the second knuckle 130. The second door 120 is hingeably attached to the second vertical side 150 by similarly using a first hinge that includes a first knuckle 205 and a second hinge that includes a second knuckle 210.

The second door 120 also includes the first handle 135 and the second handle 140 mounted on a front external surface of the second door 120. The first handle 135 is shown as having a horizontal orientation that can correspond to a default condition when the second door 120 is in the open position. A locking rod 230 is coupled to the first handle 135 such that the locking rod 230 is oriented in a substantially orthogonal direction to the first handle 135. Consequently, the locking rod 230 has a vertical orientation (upwards or downwards in alternative exemplary implementations) when the first handle 135 is oriented horizontally. The locking rod 230 can be coupled to the first handle 135 in other angular orientations in other exemplary implementations. The structure and operation of the second handle 140 can be similar to the first handle 135.

A toggle clamp 240 can be attached to a lower internal surface of the first door 115. In an alternative exemplary implementation, the toggle clamp 240 can be attached to an upper internal surface of the first door 115. The toggle clamp 240 includes a handle 241 that can be operated manually to engage the toggle clamp 240 with a catch 245 that is located in the flange 110. In an exemplary operation, the second door 120 is left in the open position and the first door 115 is swung shut to an initial closed position wherein the gasket along the three edges of the first door 115 comes in contact with a corresponding portion of the wedge-shaped projection 215 in the flange 110. A human operator (a technician, for example) then reaches in through the opening where the second door 120 is open and flips the handle 241 in the first door 115 towards the catch 245. In one exemplary implementation, the toggle clamp 240 is an adjustable toggle clamp that allows the handle 241 to be engaged with the catch 245. The action of manually flipping the handle 241 and engaging with the catch 245 pulls the first door 115 towards the flange 110 and sealingly compresses the gasket in the first door 115 against the corresponding portion of the wedge-shaped projection 215 in the flange 110.

The second door 120 can now be closed after having closed and sealed the first door 115. Closing the second door 120 can be carried out in two operations. In the first operation, the second door 120 is swung shut to an initial closed position wherein the gasket along the three edges in the second door 120 comes in contact with a corresponding portion of the wedge-shaped projection 215 in the flange 110. In the second operation, the first handle 135 is manually operated (by the technician, for example) to move the first handle 135 from the horizontal orientation to a vertical orientation (upwards or downwards in alternative exemplary implementations). The locking rod 230 that is coupled to the first handle 135 correspondingly moves from the vertical orientation to a horizontal orientation. In doing so, the locking rod 230 comes in contact with one of two sloping contact surfaces located on either side of a groove in a wedge-shaped block 250 that is located on an internal major surface of the first door 115. Each sloping contact surface is configured to provide a continuously incremental amount of pushing force that compressingly pushes the gasket along the three edges in the second door 120 against the corresponding portion of the wedge-shaped projection 215 in the flange 110 until the locking rod is seated in the groove in the wedge block. This aspect is described below in more detail using other figures.

The second step of manually operating the first handle 135 also provides for a sealed closure of a beveled inner edge 260 of the second door 120 with a beveled inner edge 265 of the first door 115. The beveled inner edge 265 of the first door 115 includes a wedge-shaped projection 305 (shown in FIG. 3) that projects towards the beveled inner edge 260 of the second door 120. The beveled inner edge 260 of the second door 120 includes a gasket 405 (shown in FIG. 4) arranged to sealingly receive the wedge-shaped projection located in the first door 115, when the second door 120 is closed and the first handle 135 is operated.

It should be understood that the second handle 140 can be operated in a manner similar to that described above with reference to first handle 135. The locking rod 235 coupled to the second handle 140 engages a wedge-shaped block 255 that can be similar to the wedge-shaped block 250.

FIG. 3 shows the wedge-shaped projection 305 in the beveled inner edge 265 of the first door 115. The beveled inner edge 265 can have a bevel angle such as about 45 degrees with respect to external major surfaces (front, upper, and lower surfaces) of the first door 115. The beveled inner edge 265 can also can include chamfers at the corners, such as a chamfered corner 310 where a front major surface of the first door 115 meets the upper major surface of the first door 115. In one exemplary implementation, the width "w1" of the wedge-shaped projection 305 provided along the beveled inner edge 265 can be less than the thickness "w2" of the first door 115. In another exemplary implementation, the width "w1" of the wedge-shaped projection 305 provided along the beveled inner edge 265 can be substantially equal to the thickness "w2" of the first door 115.

FIG. 4 shows the gasket 405 disposed along the beveled inner edge 260 of the second door 120. The gasket 405 is arranged to sealingly receive the wedge-shaped projection 305 located in the first door 115, when the second door 120 is closed and one or both of the first handle 135 and the second handle 140 is operated. The bevel angle of the beveled inner edge 260 of the second door 120 is configured to complement the bevel angle of the beveled inner edge 265 of the first door 115. Consequently, when the beveled inner edge 265 of the first door 115 has a bevel angle of about 45 degrees, the beveled inner edge 260 of the second door 120 is also selected to have a bevel angle of about 45 degrees. The beveled inner edge 260 can also can include chamfers at the corners, such as a chamfered corner 410 where a front major surface of the second door 120 meets the upper major surface of the second door 120.

In one exemplary implementation, the width "w3" of the gasket 405 provided along the beveled inner edge 260 can be less than the thickness "w4" of the second door 120. In another exemplary implementation, the width "w3" of the gasket 405 can be substantially equal to the thickness "w4" of the second door 120.

The gasket 405 can be one of many types of gaskets and can be disposed along the beveled inner edge 260 of the second door 120 in various ways, such as by using a channel gasket that is disposed in a channel, or by using a sealing gasket that is attached to the beveled inner edge 260 by using an adhesive.

FIG. 5 shows the beveled inner edge 260 of the second door 120 next to the beveled inner edge 265 of the first door 115 as the second door 120 is moved to a partially closed position after the first door 115 is closed and sealed by operating the toggle clamp 240. The gap that is seen between the beveled inner edge 260 of the second door 120 next and the beveled inner edge 265 of the first door 115 is closed and compressively sealed after the second door 120 is fully closed and one or both of the first handle 135 and the second handle 140 is operated. When compressively sealed, the wedge-shaped projection 305 (shown in FIG. 3) provided along the beveled inner edge 265 of the first door 115 compressively mates with the gasket 405 (shown in FIG. 4) located in the beveled inner edge 260 of the second door 120.

FIG. 6 shows a close-up view of the second handle 140 that is attached to the second door 120. The locking rod 235 is pointing downwards because the second handle 140 is in the default condition when the second door 120 is in the open position. The portion of the beveled inner edge 260 that is shown in FIG. 6 includes a chamfered corner 610 where a front major surface of the second door 120 meets the lower major surface of the second door 120. Also shown, is a portion of the wedge-shaped projection 215 that is provided all along the perimeter of the flange 110 that is attached to the housing 105.

FIG. 7 shows an upper section view of the exemplary toggle clamp 240 attached to an internal surface of the first door 115. As shown, the toggle clamp 240 is engaged with the catch 245 that is provided in the flange 110. Also shown, is the door handle 135 in a position where the second door 120 is in the closed position and the locking rod 230 is seated in the groove in the wedge-shaped block 250 provided in the first door 115. In an alternative exemplary implementation, the door handle 135 can be located on the first door 115 and the wedge-shaped block 250 can be located on the second door 120. Similarly, the toggle clamp 240 can be provided in the second door 120 instead of the first door 115 and the catch 245 aligned accordingly in the flange 110. When so provided, the second door 120 is closed first, followed by manually operating the toggle clamp 240 to engage with the catch 245. The first door 115 can then be closed and sealed by operating one or more door handles such as the door handle 135 located on the first door 115.

FIG. 8 illustrates a perspective view of the locking bar 235 of the second handle 140 that is mounted on the front external surface of the second door 120 according to an exemplary embodiment of the disclosure. An upwards movement of the second handle 140 initiated by a technician (not shown) for locking the second door 120 causes the locking bar 235 to come in contact with a bottom end of a first sloping contact surface 803 of the wedge block 255. The first sloping contact surface 803 is configured to provide a continuously incremental amount of pushing force that compressingly pushes the gasket 405 disposed along the beveled inner edge 260 of the second door 120 against the wedge-shaped projection 305 in the beveled inner edge 265 of the first door 115 until the locking rod 235 engages with the groove 802 in the wedge block 255.

Alternatively, when the second handle 140 is configured to be moved downwards for locking the second door 120, a downwards movement of the second handle 140 initiated by the technician (not shown) for locking the second door 120 causes the locking bar 235 to come in contact with an upper end of a second sloping contact surface 801 of the wedge block 255. The second sloping contact surface 801 is configured to provide a continuously incremental amount of pushing force that compressingly pushes the gasket 405 disposed along the beveled inner edge 260 of the second door 120 against the wedge-shaped projection 305 in the beveled inner edge 265 of the first door 115 until the locking rod 235 engages with the groove 802 in the wedge block 255.

In another exemplary implementation, the wedge block 255 can have a single sloping contact surface (one that is either above or below the groove 802) and the second handle 140 configured to be moved only upwards or downwards correspondingly. FIG. 8 also illustrates the toggle clamp 240 (attached to a lower internal surface of the first door 115) engaged with the catch 245 located in the flange 110.

FIG. 9 illustrates the locking bar 235 of the second handle 140 seated in the groove 802 in the wedge block 255 shown in FIG. 8. When so seated, the second door 120 is in a locked condition.

Figure 10A:
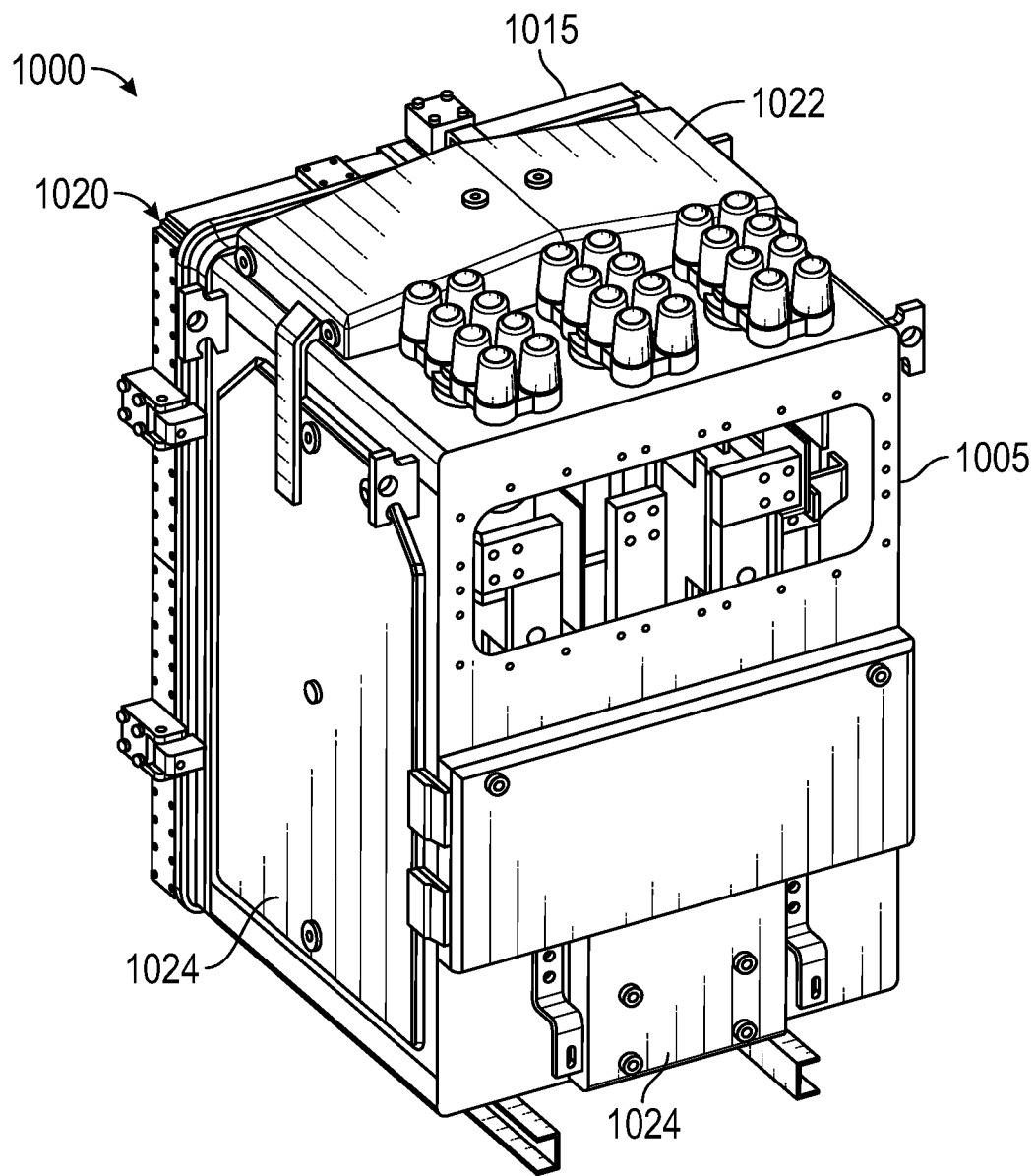
Figure 10B:
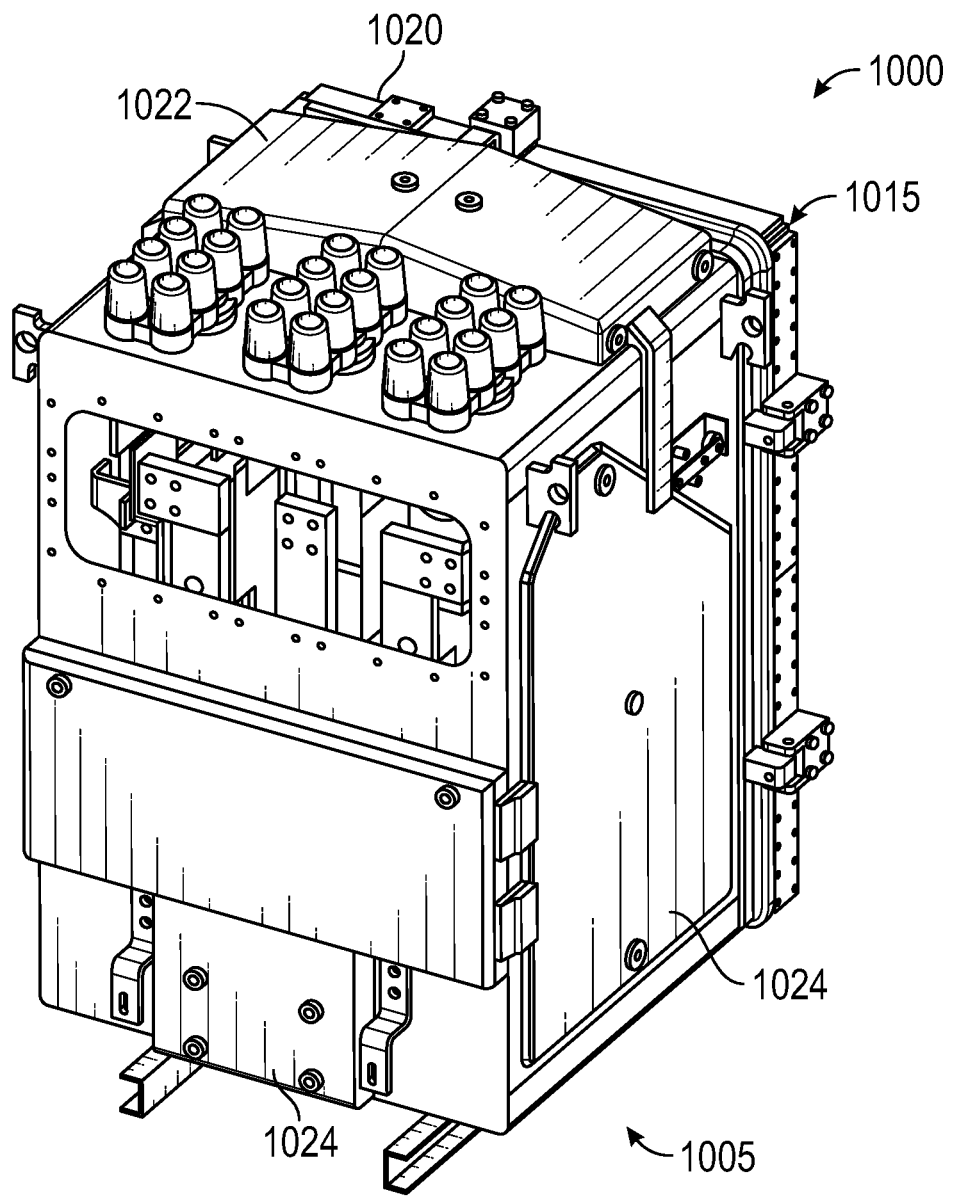

FIGS. 10A-10E illustrate several exemplary perspectives of a cooling system of an enclosure 1000 (which may be the same as enclosure 100 depicted and described with respect to FIG. 1, or any other enclosure described herein). The cooling system depicted in FIGS. 10A-10E may only include one or more false walls 1024 of the cooling system, which may only be one component of an exemplary cooling system. For example, FIGS. 10A and 10B depict two exemplary orthogonal perspectives of the cooling system depicting only the false walls 1024 of the cooling system. FIGS. 11A-11E depict more details of the cooling system (e.g., including the addition of the "pancake panels," which may be defined with respect to FIGS. 11A-11E), and FIGS. 12A-12B may depict an entire exemplary cooling system (e.g., also including coolant pipes). Depicting only some components of the cooling system in each of FIGS. 10A-10E and 11A-11E may serve to provide a better view of each component of the cooling system (for example, it may be difficult to view the false walls 1024 when the pancake panels are shown as the pancake panels may be located in front of the false walls 1024).

Figure 10C:
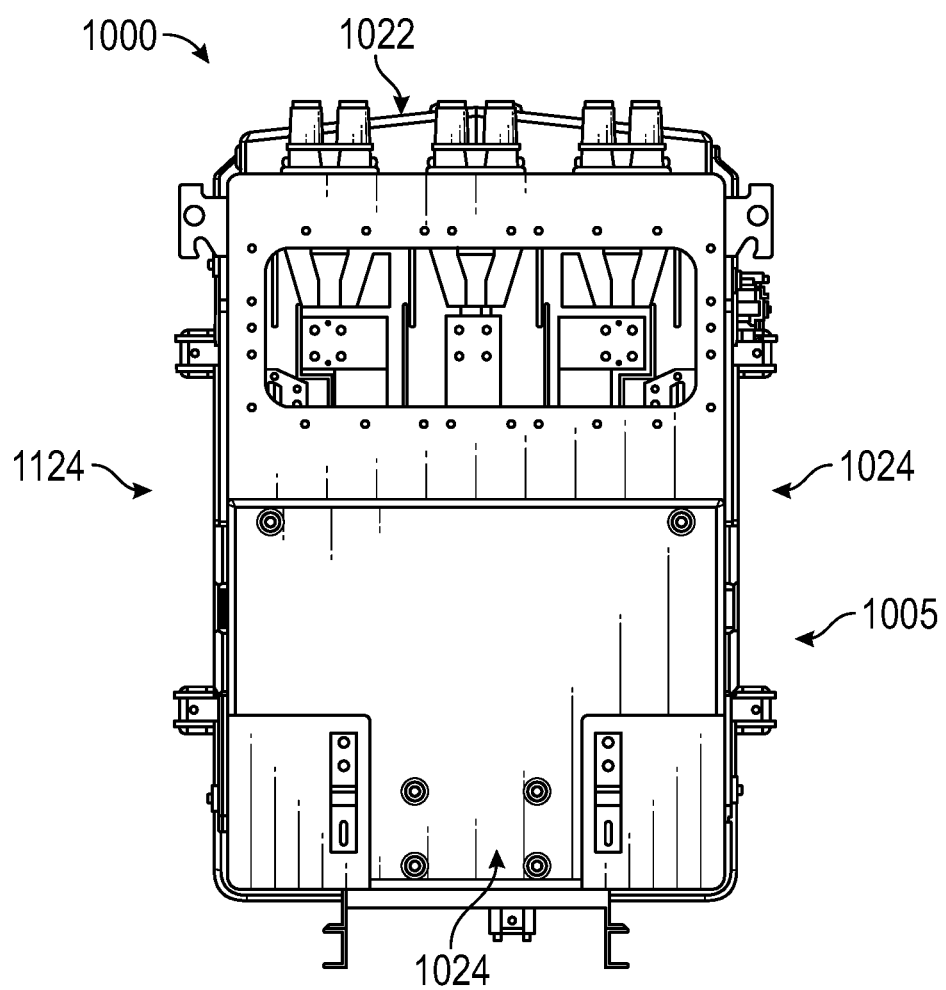
Figure 10D:
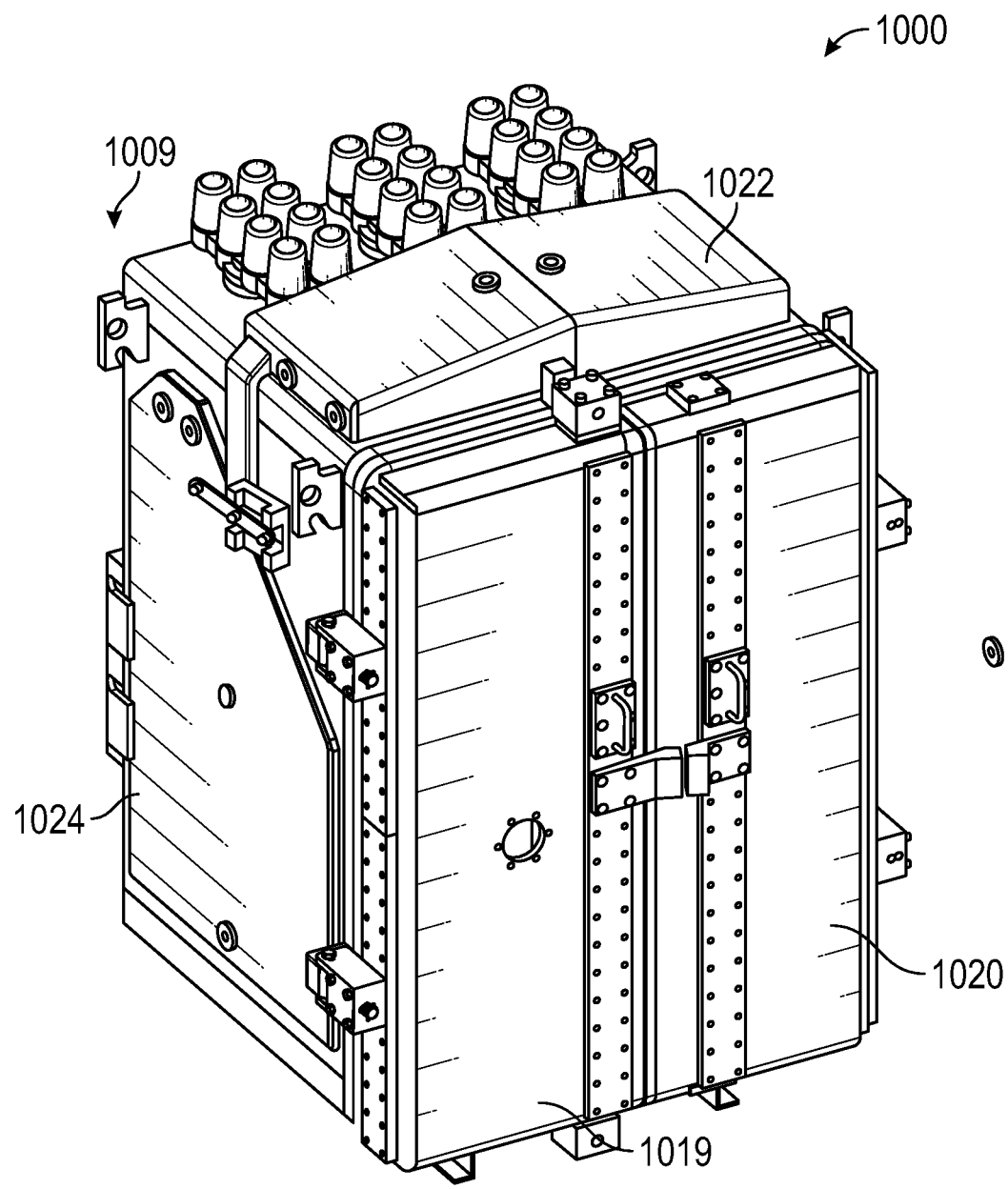
Figure 10E:
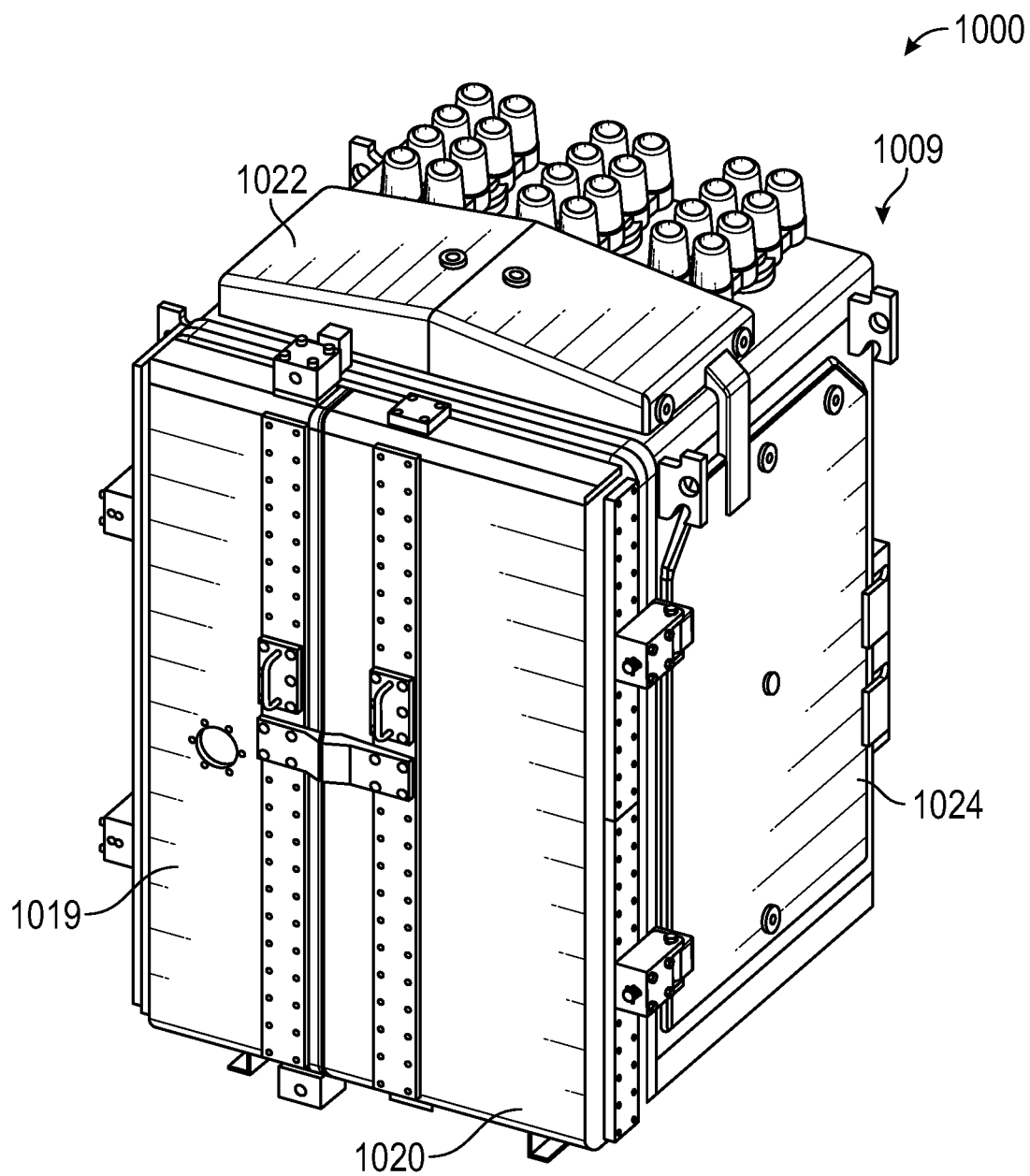

In some embodiments, as depicted in FIGS. 10A and 10B, the enclosure 1000 may include a housing 1005 (which may be the same as housing 105 depicted and described with reference to FIG. 1, as well as any other housing described herein), and one or more doors (which may include, for example, a first door 1015 and/or a second door 1020). The first door 1015 may be the same as the first door 115 described and depicted with respect to FIG. 1, or any other door described herein. The second door 1020 may be the same as the second door 120 described and depicted with respect to FIG. 1, or any other door described herein). The cooling system may located externally to the housing 1015. That is, in some embodiments, none of the components of the cooling system may come into direct contact with any of the electrical components housed within the enclosure 1000, and may simply come into contact with the housing 1015 of the enclosure. Temperature testing has shown that coolant liquid does not have to be in direct contact with the heat source in order to provide a means of housing cooling. This may be because the heat source being generated from the breaker may be transferred through convection in the housing's air space onto the housing's enclosure material and panel(s) through conduction, liquid, and air convection. This may provide an advantage over conventional methods of convection onto the housing's enclosure material and fin(s). The cooling system may include at least a coolant reservoir 1022 and one or more false walls 1024 (as well as any of the other components included in FIGS. 11A-11E and 12A-12B as described below). The coolant reservoir 1022 may be located on a top portion of the housing 1015, and may store coolant that circulates through the cooling system of the enclosure 1000 to cool the enclosure and the electrical components housed within the enclosure 1000. The coolant reservoir 1022 may act as a dedicated air space to allow for thermal expansion of fluid prevent sudden rupture. Examples of coolant fluid may include, but may not be limited to, oil, antifreeze, glycol, and glycerin. In some embodiments, the coolant reservoir 1022 may be located on any other portion of the housing 1015, including, for example, any of the sides of the housing 1015 and/or the bottom of the housing 1015. Additionally, there may be more than one coolant reservoir 1022 in the cooling system. The false walls 1024 may be in direct contact with the housing 1015 and may serve as one portion of the cooling system through which the coolant housed in the coolant reservoir 1022 circulates. FIGS. 10C-10E provide additional orthogonal perspectives that may depict additional false walls 1024 of the cooling system.

Figure 11A:
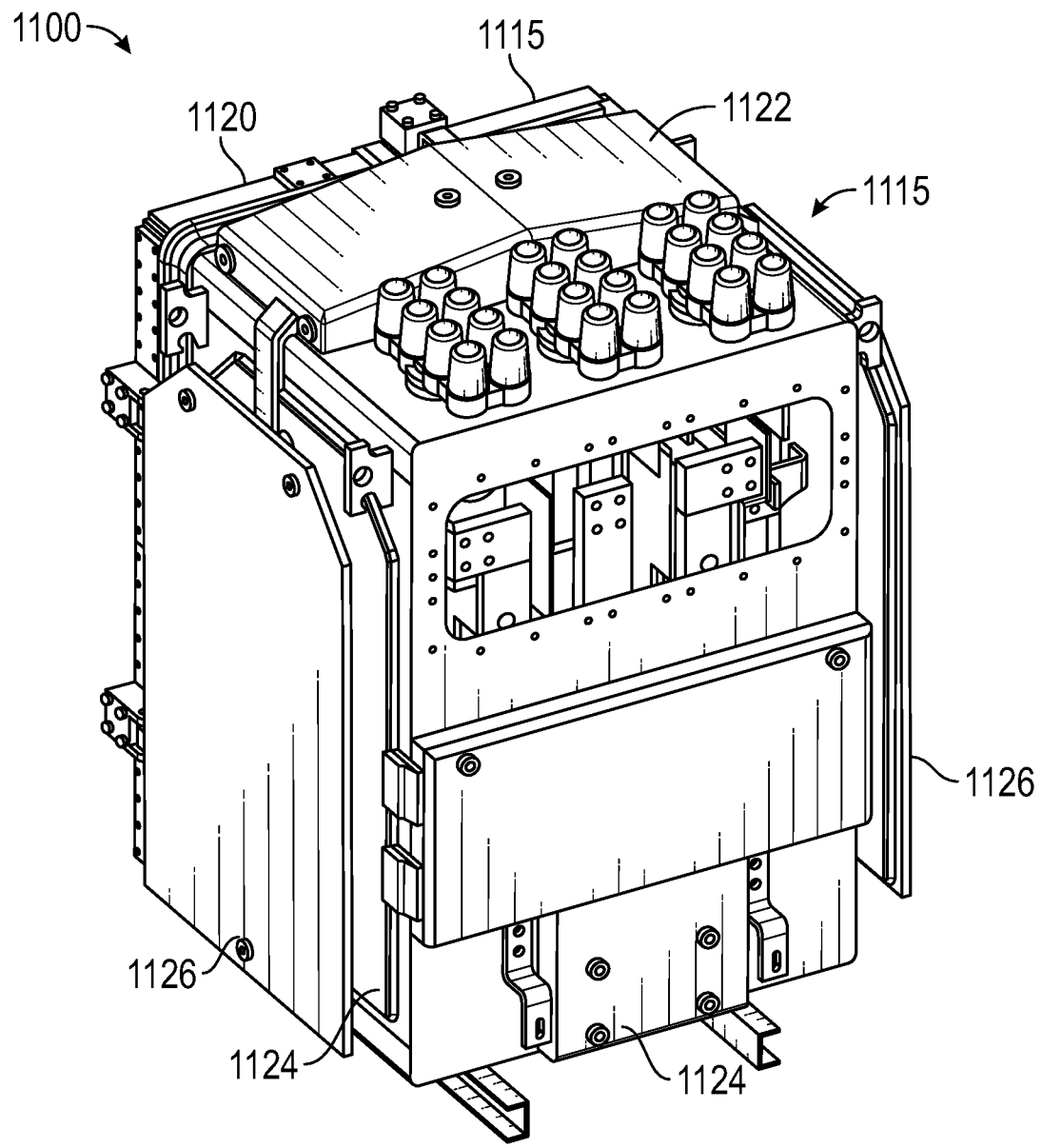
Figure 11B:
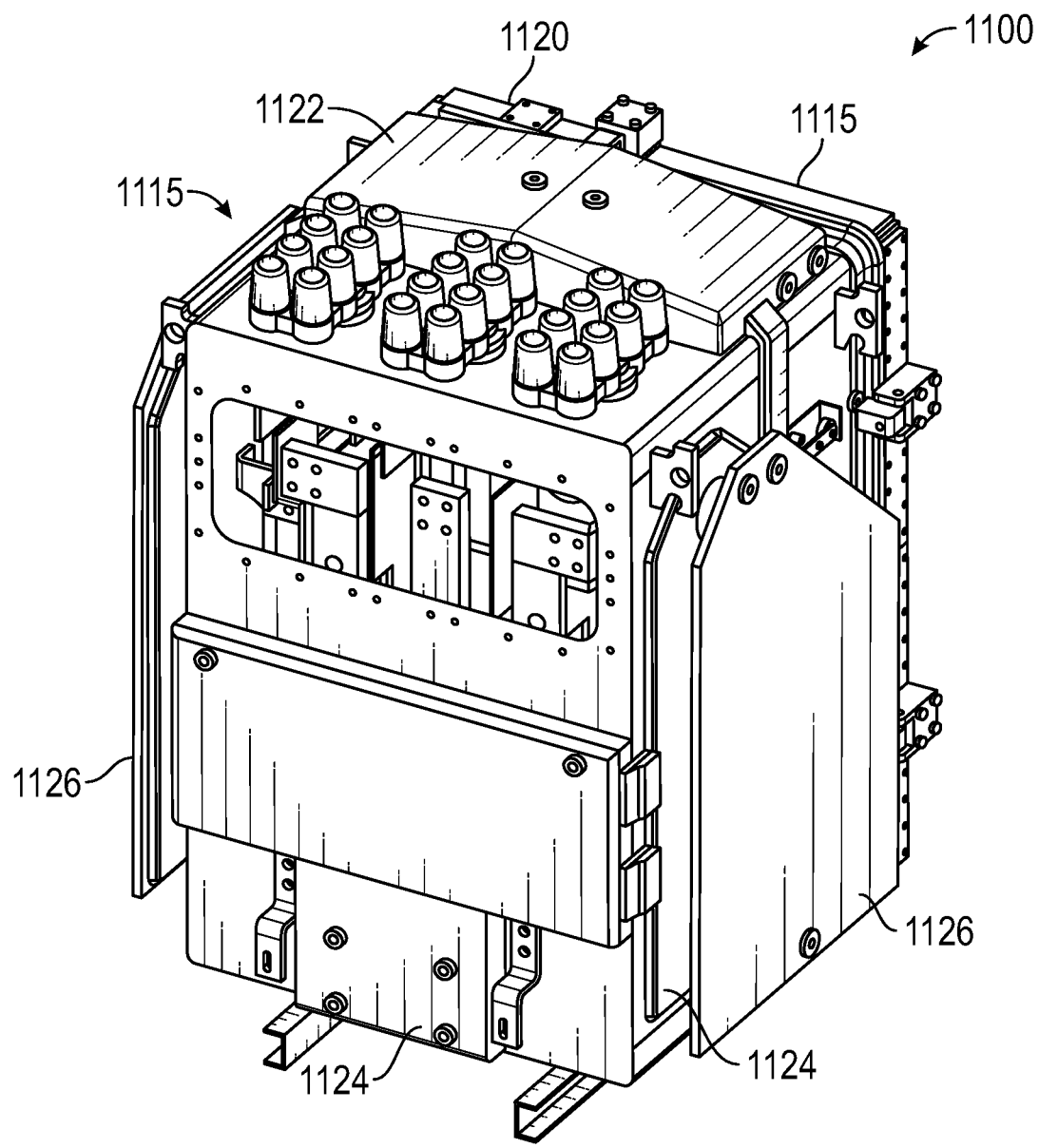
Figure 11C:
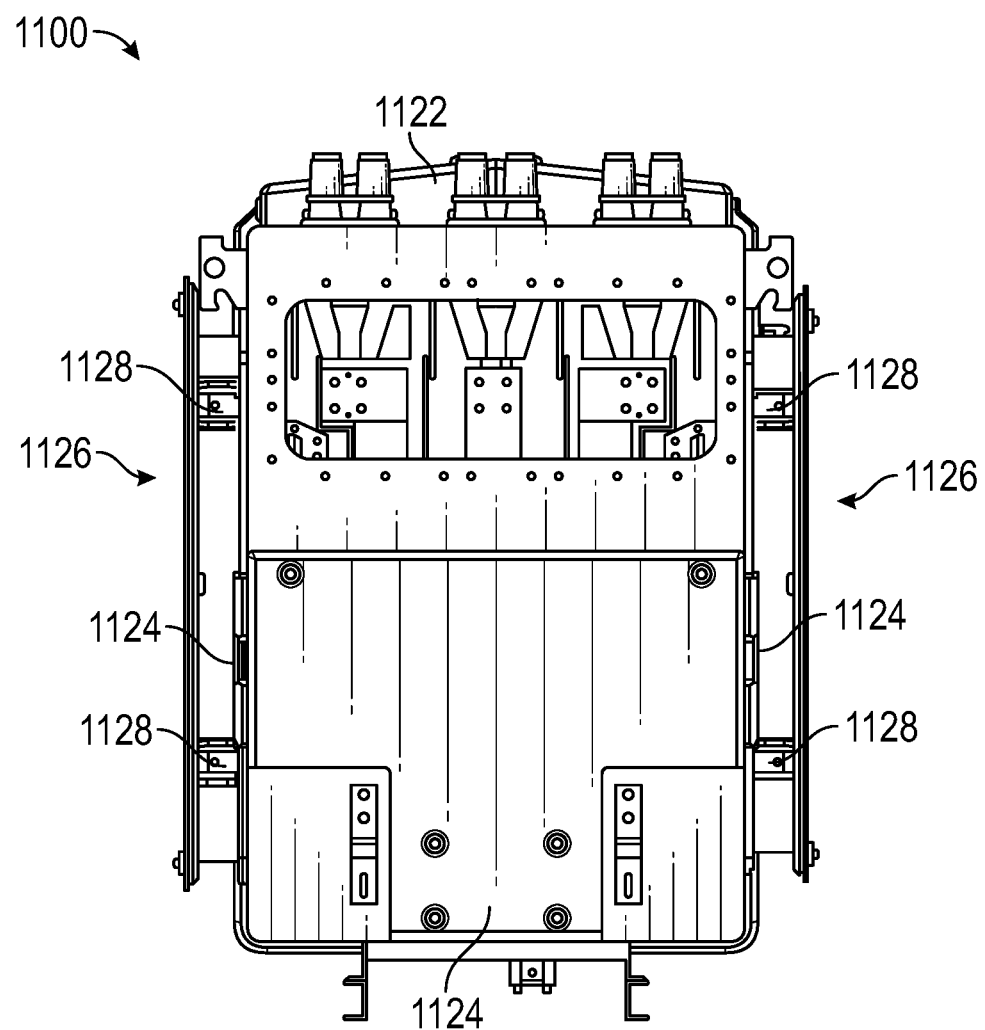
Figure 11D:
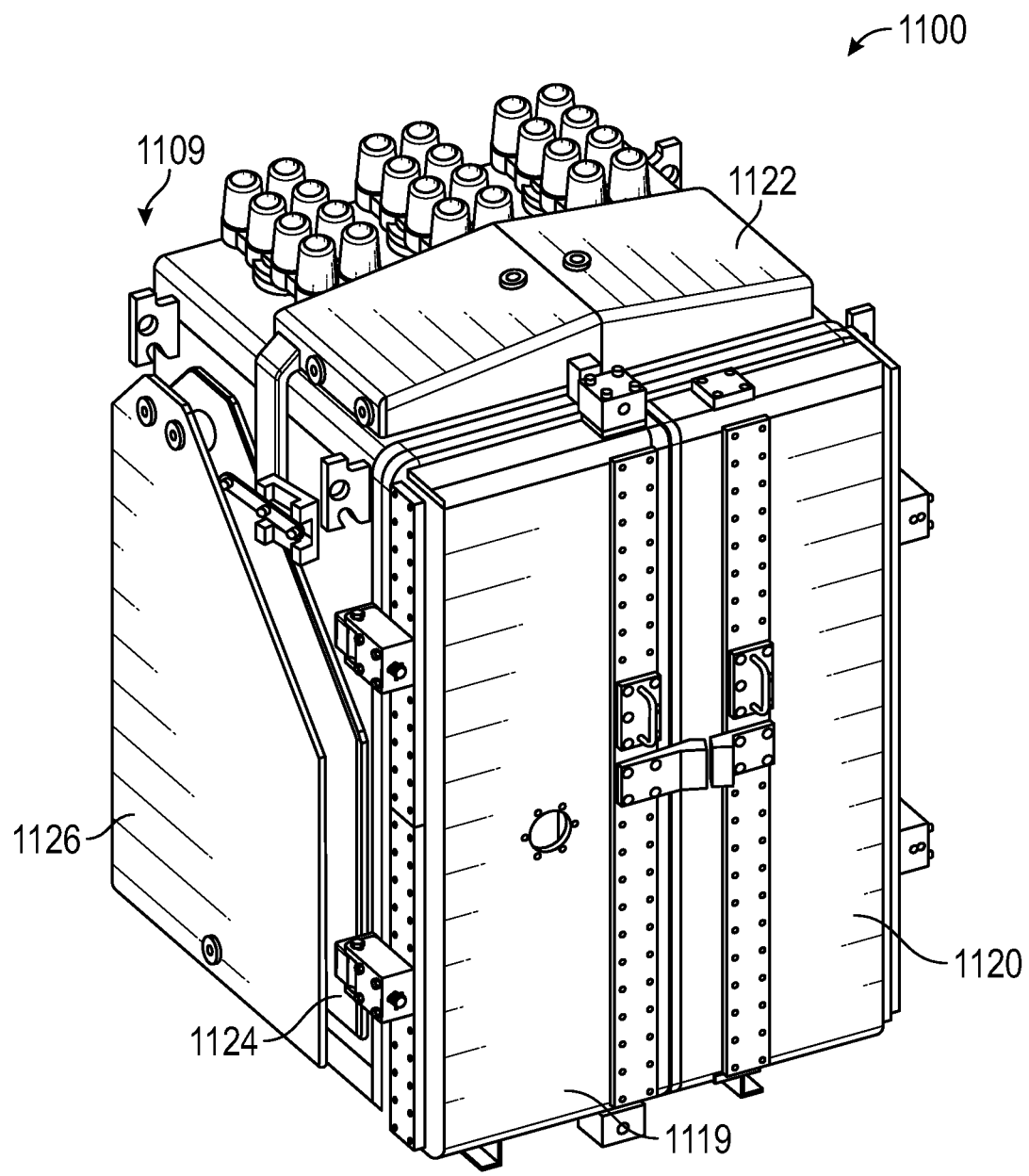
Figure 11E:
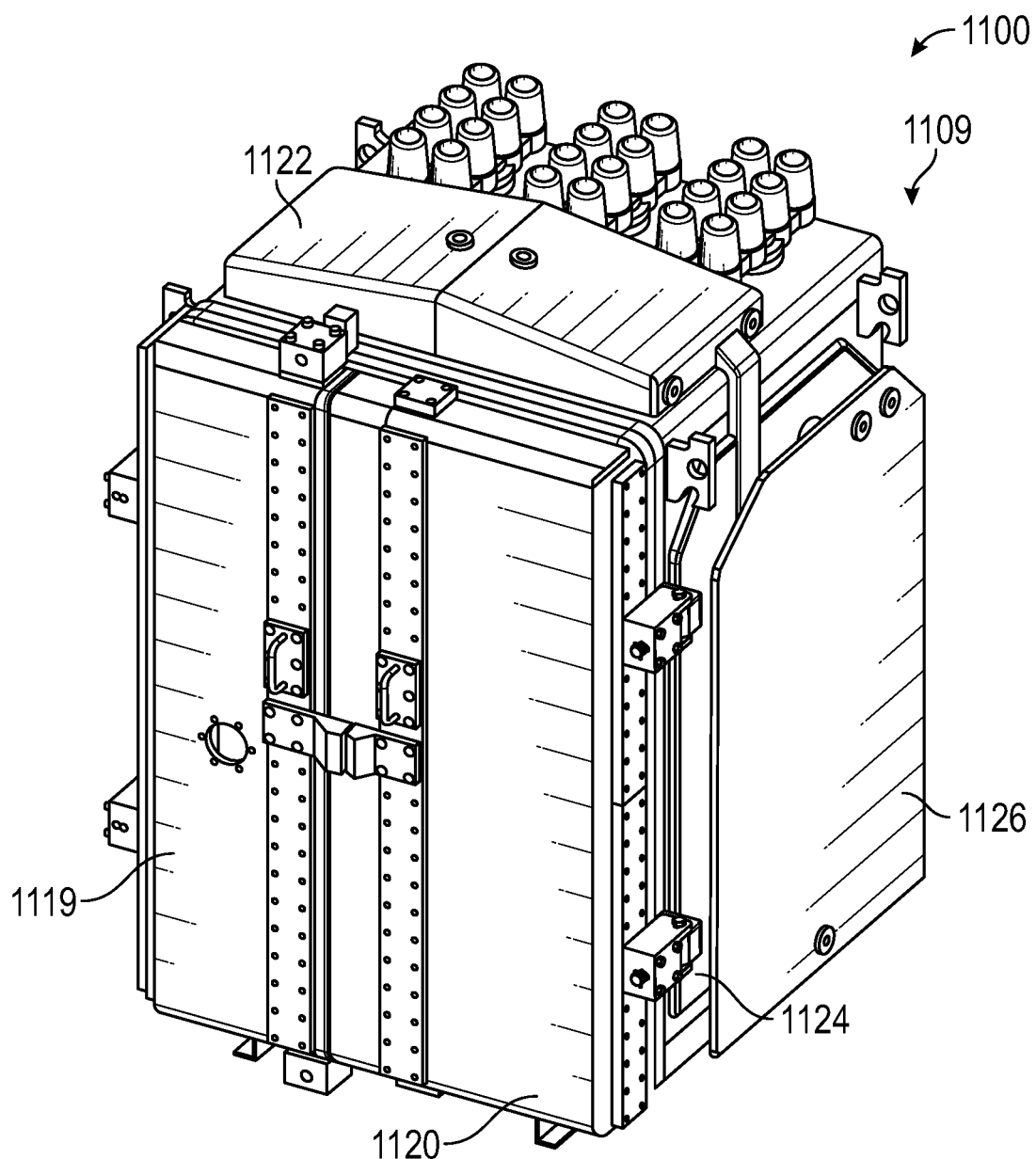

FIGS. 11A-11E illustrate several exemplary perspectives of a cooling system of an enclosure 1100 (which may be the same as enclosure 1000 depicted and described with respect to FIGS. 10A-10E, or any other enclosure described herein). The cooling system shown in FIGS. 11A-11E may include both the false walls 1124 (which may be the same as false walls 1024 depicted and described with respect to FIGS. 10A-10E) and the pancake panels 1126 of the cooling system. That is, FIGS. 11A-11E may include more of the components of an exemplary full coolant system as depicted in FIGS. 12A-12B. In some embodiments, pancake panels 1126 may serve as an additional component of the cooling system, and may be located further externally from the housing 1115 (which may be the same as housing 1015 depicted and described with respect to FIGS. 10A-10E and/or any other housing described herein) and the false walls 1124. In some instances, the pancake panels 1126 may be aligned with the false walls 1124 such that the pancake panels 1126 may be located nearby any false walls 1124 that exist in the cooling system. In some instances, however, not every false wall 1124 may have an associated pancake panel 1126. Additionally, as depicted in FIG. 11C, the pancake panels 1126 may be connected to the false walls 1124 through one or more header pipes 1128. In some instances, the header pipes 1128 may be pipes that extend between the false walls 1124 and pancake panels 1126 and allow coolant to circulate from the coolant reservoir 1122 (which may be the same as coolant reservoir 1022 described and depicted with respect to FIGS. 10A-10E) and through the false walls 1124 and/or the pancake panels 1126. FIGS. 11D and 11E provide additional orthogonal perspectives that may show additional false walls 1124 and pancake plates 1126 of the cooling system.

FIGS. 12A and 12B illustrate several exemplary perspectives of a cooling system of an enclosure which may depict all of the components of an exemplary cooling system. That is, while FIGS. 10A-10E only show false walls, FIGS. 11A-11E only show false walls and pancake panels, FIGS.

12A and 12B show false walls 1224, pancake panels 1226, and coolant piping 1228 of the cooling system. That is, the cooling system depicted in FIGS. 12A and 12B may include all of the components of FIGS. 11A-11E (e.g., the false walls 1224 and the pancake panels 1226), as well as the addition of the coolant pipes 1228. The coolant pipes 1228 may serve to circulate coolant from the coolant reservoir 1222 (which may be the same as coolant reservoir 1022 and/or 1122) to the pancake panels 1226 and/or the false walls 1224. That is, during operation of the coolant system, coolant may circulate from the coolant reservoir 1222 through a first coolant pipe 1230, through a pancake panel 1231 attached to the first coolant pipe 1230, then through one or more header pipes 1240 of the first pancake panel 1231 to a first false wall 1232, back through the one or more header pipes of the first pancake panel 1231. The coolant may then circulate through a second coolant pipe 1233 to a second false wall 1234, through a third coolant pipe 1235 to a second pancake panel 1236, through one or more header pipes 1241 of the second pancake panel 1236 to a second false wall 1237, back through the one or more second header pipes 1241 to the second pancake panel 1236, and finally through a fourth coolant pipe 1238 back to the coolant reservoir 1222. This, however, is merely an exemplification of the coolant flow through the cooling system, and the coolant may flow in any direction and through any of the components described herein in any given order. Additionally, the cooling systems described with respect to FIGS. 10A-10E, FIGS. 11A-11E, and FIGS. 12A and 12B may include any combination of the components in any number and configuration (e.g., more or less pancake panels may be included in the cooling systems depicted in the FIGs.).

In some embodiments, the circulation of coolant through any of the components of the cooling system described with respect to FIGS. 10A-10E, 11A-11E, and/or 12A and 12B may be performed based on a relative temperature difference between different areas of the cooling system. For example, a 5-10 degree Fahrenheit difference between areas of the cooling system may exist, where the temperature difference is sufficient to cause the coolant to circulate through the various components.

Many modifications and other embodiments of the example descriptions set forth herein to which these descriptions pertain will come to mind having the benefit of the teachings presented in the foregoing descriptions and the associated drawings. Thus, it will be appreciated the disclosure may be embodied in many forms and should not be limited to the exemplary embodiments described above. Therefore, it is to be understood that the disclosure is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed is:

1. An enclosure for an electrical network protection element comprising:
    a housing having an interior portion configured to accommodate the electrical network protection element;
    a flange attached to the housing;
    a first door hingeably attached to a first vertical side of the flange, the first door including
        a first wedge projection along a beveled inner edge of the first door; and
    a second door hingeably attached to a second vertical side of the flange, the second door including a first channel gasket along a beveled inner edge of the second door, the first channel gasket of the second door arranged to provide a compression sealing in cooperation with the first wedge projection in the beveled inner edge of the first door; and
    a cooling system connected to the housing comprising:
        one or more false walls connected to an external surface of the housing;
        one or more panels connected to at least one of the one or more false walls; and
        one or more coolant transfer pipes connected to the one or more panels and further connected to a coolant reservoir, wherein the one or more coolant transfer pipes circulate coolant through at least one of: the coolant reservoir, the one or more panels, and the one or more false walls.

2. The enclosure of claim 1, wherein the one or more false walls, one or more panels, and one or more coolant transfer pipes are not in contact with the electrical network protection element located within the housing.

3. The enclosure of claim 1, wherein no coolant is introduced to the interior portion of the housing in which the electrical network protection element is located.

4. The enclosure of claim 1, wherein the one or more panels are connected to at least one of the one or more false walls through one or more header pipes, wherein coolant circulates between the one or more panels and the one or more false walls through the one or more header pipes.

5. The enclosure of claim 1, wherein the coolant reservoir is located on an upper surface of the enclosure.

6. The enclosure of claim 1, wherein the one or more false walls comprise: a first false wall located between the coolant reservoir and the housing, a second false wall located on a first side of the housing, a third false wall located on a second side of the housing, and a fourth false wall located on a third side of the housing, wherein the second false wall is connected to a first panel and the third false wall is connected to a second panel.

7. The enclosure of claim 1, wherein a temperature gradient caused by a difference between a first temperature associated with an upper surface of the enclosure and a second temperature associated with a lower surface of the enclosure, causes coolant circulation through the cooling system.

8. An enclosure for an electrical network protection element comprising:
    a housing having an interior portion configured to accommodate the electrical network protection element;
    one or more doors hingeably attached to the housing; and
    a cooling system connected to the housing comprising:
        one or more false walls connected to an external surface of the housing;
        one or more panels connected to at least one of the one or more false walls; and
        one or more coolant transfer pipes connected to the one or more panels and further connected to a coolant reservoir, wherein the one or more coolant transfer pipes circulate coolant through at least one of: the coolant reservoir, the one or more panels, and the one or more false walls, wherein the one or more panels are connected to at least one of the one or more false walls through one or more header pipes, wherein coolant circulates between the one or more panels and the one or more false walls through the one or more header pipes.

9. The enclosure of claim 8, wherein the one or more false walls, one or more panels, and one or more coolant transfer pipes are not in contact with the electrical network protection element located within the housing.

10. The enclosure of claim 8, wherein no coolant is introduced to the interior portion of the housing in which the electrical network protection element is located.

11. The enclosure of claim 8, wherein the coolant reservoir is located on an upper surface of the enclosure.

12. The enclosure of claim 8, wherein the one or more false walls comprise: a first false wall located between the coolant reservoir and the housing, a second false wall located on a first side of the housing, a third false wall located on a second side of the housing, and a fourth false wall located on a third side of the housing, wherein the second false wall is connected to a first panel and the third false wall is connected to a second panel.

13. A cooling system for an enclosure for an electrical network protection element comprising:
  one or more false walls connected to an external surface of a housing of the enclosure, wherein the housing of the enclosure includes an interior portion configured to accommodate the electrical network protection element;
  one or more panels connected to at least one of the one or more false walls; and
  one or more coolant transfer pipes connected to the one or more panels and further connected to a coolant reservoir, wherein the one or more coolant transfer pipes circulate coolant through at least one of: the coolant reservoir, the one or more panels, and the one or more false walls, wherein a temperature gradient caused by a difference between a first temperature associated with an upper surface of the enclosure and a second temperature associated with a lower surface of the enclosure, causes coolant circulation through the cooling system.

14. The cooling system of claim 13, wherein the one or more false walls, one or more panels, and one or more coolant transfer pipes are not in contact with the electrical network protection element located within the housing.

15. The cooling system of claim 13, wherein no coolant is introduced to the interior portion of the housing in which the electrical network protection element is located.

16. The cooling system of claim 13, wherein the one or more panels are connected to at least one of the one or more false walls through one or more header pipes, wherein coolant circulates between the one or more panels and the one or more false walls through the one or more header pipes.

17. The cooling system of claim 13, wherein the coolant reservoir is located on an upper surface of the enclosure.

18. The cooling system of claim 13, wherein the one or more false walls comprise: a first false wall located between the coolant reservoir and the housing, a second false wall located on a first side of the housing, a third false wall located on a second side of the housing, and a fourth false wall located on a third side of the housing, wherein the second false wall is connected to a first panel and the third false wall is connected to a second panel.

* * * * *